(12) United States Patent
Kim et al.

(10) Patent No.: US 11,997,804 B2
(45) Date of Patent: May 28, 2024

(54) DISPLAY DEVICE

(71) Applicant: Samsung Display Co., Ltd., Yongin-si (KR)

(72) Inventors: Beomjin Kim, Asan-si (KR); Jonghwa Lee, Hwaseong-si (KR); Dongwon Choi, Seoul (KR); Jin Hwan Choi, Seoul (KR); Taewoong Kim, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/538,056

(22) Filed: Nov. 30, 2021

(65) Prior Publication Data
US 2022/0264754 A1    Aug. 18, 2022

(30) Foreign Application Priority Data

Feb. 15, 2021   (KR) .................. 10-2021-0019941

(51) Int. Cl.
*H05K 5/02*       (2006.01)
*H05K 5/00*       (2006.01)

(52) U.S. Cl.
CPC .......... *H05K 5/0217* (2013.01); *H05K 5/0017* (2013.01)

(58) Field of Classification Search
CPC ... G06F 1/1607; G06F 1/1652; H05K 5/0017; H05K 5/0217
See application file for complete search history.

(56) References Cited

U.S. PATENT DOCUMENTS

| | | | |
|---|---|---|---|
| 7,710,370 B2* | 5/2010 | Slikkerveer | G09F 11/29 345/31 |
| 9,811,119 B2* | 11/2017 | Seo | H04M 1/0268 |
| 10,074,824 B2 | 9/2018 | Han et al. | |
| 10,481,640 B2 | 11/2019 | Kim et al. | |
| 10,684,652 B2 | 6/2020 | Kim et al. | |
| 10,809,552 B2 | 10/2020 | Park et al. | |
| 11,127,323 B2* | 9/2021 | Kim | G06F 1/1641 |
| 11,216,106 B2* | 1/2022 | Lindblad | G06F 1/1652 |
| 2007/0211036 A1 | 9/2007 | Perkins | |

(Continued)

FOREIGN PATENT DOCUMENTS

KR   10-2015-0134262    12/2015
KR   10-2016-0025152    3/2016

(Continued)

OTHER PUBLICATIONS

International Search Report, corresponding to International Application No. PCT/KR2021/018860 dated Mar. 22, 2022.

*Primary Examiner* — Sagar Shrestha
(74) *Attorney, Agent, or Firm* — KILE PARK REED & HOUTTEMAN PLLC

(57) ABSTRACT

A display device includes a display module and a module supporter below the display module. The module supporter includes a support layer, and a plurality of support bars in the support layer and arranged in a first direction. The plurality of support bars extend in a second direction that intersects the first direction. At least one groove having a predetermined shape is formed on lateral surfaces of at least one of the plurality of support bars. The lateral surfaces are opposite to each other in the first direction.

21 Claims, 20 Drawing Sheets

(56) References Cited

U.S. PATENT DOCUMENTS

| | | | | |
|---|---|---|---|---|
| 2015/0055287 | A1* | 2/2015 | Seo | G06F 1/1641 |
| | | | | 361/679.27 |
| 2015/0077363 | A1* | 3/2015 | Yairi | G06F 3/0412 |
| | | | | 345/173 |
| 2015/0340004 | A1 | 11/2015 | Pang | |
| 2016/0064685 | A1* | 3/2016 | Kim | B32B 37/003 |
| | | | | 428/137 |
| 2017/0003528 | A1* | 1/2017 | Higano | G02F 1/1333 |
| 2017/0285688 | A1* | 10/2017 | Sun | G06F 1/1681 |
| 2017/0358636 | A1* | 12/2017 | Kim | G09F 9/301 |
| 2018/0033834 | A1* | 2/2018 | Jun | G06F 3/0446 |
| 2019/0037710 | A1* | 1/2019 | Han | G09F 9/301 |
| 2019/0064881 | A1* | 2/2019 | Kim | G06F 1/1652 |
| 2019/0174640 | A1* | 6/2019 | Park | H05K 5/0017 |
| 2020/0103741 | A1* | 4/2020 | Song | G09F 9/301 |
| 2021/0107251 | A1* | 4/2021 | Chen | B32B 3/16 |
| 2021/0158727 | A1* | 5/2021 | Choi | G06F 1/181 |
| 2022/0217857 | A1* | 7/2022 | Li | G06F 1/1641 |
| 2022/0357775 | A1* | 11/2022 | Choi | G06F 1/1652 |

FOREIGN PATENT DOCUMENTS

| | | |
|---|---|---|
| KR | 10-2017-0019043 | 2/2017 |
| KR | 10-2017-0140465 | 12/2017 |
| KR | 10-2018-0036904 | 4/2018 |
| KR | 10-2019-0023919 | 3/2019 |
| KR | 10-2019-0065852 | 6/2019 |
| KR | 10-2021-0041665 | 4/2021 |

* cited by examiner

DISPLAY DEVICE

CROSS-REFERENCE TO RELATED APPLICATION(S)

This U.S. nonprovisional application claims priority to and the benefit of Korean Patent Application No. 10-2021-0019941 under 35 U.S.C. § 119, filed on Feb. 15, 2021, in the Korean Intellectual Property Office (KIPO), the entire contents of which are incorporated herein by.

BACKGROUND

The disclosure relates to a display device.

Electronic products such as smart phones, digital cameras, laptop computers, navigation systems, and smart televisions include a display device for displaying an image to users. The display device generates an image and provides users with the image displayed on a display screen.

With the advancement of display technology, various type display devices have recently been being developed. A typical example of such display devices is a flexible display device that can be curvedly deformable, foldable, or rollable. The flexible display device may be easy to carry and to increase user's convenience.

A rollable display device, one of the flexible display device, includes a display module, a roller around which the display module is wrapped, and a housing in which the display module and the roller are accommodated. The roller rotates to withdraw the display module from the housing or to introduce the display module into the housing.

SUMMARY

The disclosure provides a display device that allows a display module to have increased surface quality.

According to an embodiment of the disclosure, a display device may comprise a display module; and a module supporter below the display module. The module supporter may include a support layer; and a plurality of support bars in the support layer and arranged in a first direction. The plurality of support bars may extend in a second direction that intersects the first direction. A groove having a predetermined shape may be formed on lateral surfaces of at least one of the plurality of support bars. The lateral surfaces may be opposite to each other in the first direction.

The at least one of the plurality of support bars may a first part that faces the display module; a second part below the first part; and a third part between the first part and the second part, the third part having a width in the first direction less than a width in the first direction of each of the first and second parts.

The width in the first direction of the first part may increase in an upward direction toward the display module.

The width in the first direction of the second part may increase in a downward direction away from the display module.

The third part may have a constant width and extends from the first part toward the second part.

A size of the first part may be greater than a size of the second part.

A length in the first direction of a top surface of the first part may be greater than a length in the first direction of a bottom surface of the second part.

The support layer may include a first support layer between the first parts of the plurality of support bars that are adjacent to each other; a second support layer between the second parts of the plurality of support bars that are adjacent to each other; and a third support layer between the third parts of the plurality of support bars that are adjacent to each other. A width in the first direction of the third support layer may be greater than a width in the first direction of the first support layer and than a width in the first direction of the second support layer.

The at least one groove may include a plurality of grooves, and a first volume of the support layer between the plurality of grooves that are adjacent to each other is greater than a second volume of the support layer on each of the plurality of support bars and than a third volume of the support layer below each of the plurality of support bars.

The at least one groove may in the second direction.

The support layer may fill the at least one groove.

The at least one groove may have a letter "V" shape.

The at least one groove may have a concavely curved shape.

Each of the lateral surfaces may include a plurality of protrusions.

A top surface of at least one of the plurality of support bars may have a curved surface that is upwardly convex, the top surface facing the display module.

Each of the plurality of support bars may have a modulus greater than a modulus of the support layer.

The support layer may include a support film that includes an elastomeric polymer; and the support film may include a material having a negative coefficient of thermal expansion.

The support bar may include a first part that faces the display module; a second part below the first part and having a size less than a size of the first part; and a third part having a width smaller than a width of each of the first part and the second part in a direction intersecting the direction, the third part extending from the first part toward the second part.

According to an embodiment of the disclosure, a display device may comprise a display module; a support layer below the display module; and a support bar in the support layer and extending in a direction. The support bar may have a dumbbell shape when viewed in the direction.

According to an embodiment of the disclosure, a display device may comprise a display module; a support layer below the display module; and a plurality of support bars in the support layer and arranged in a first direction. The plurality of support bars may extend in a second direction that intersects the first direction. At least one of the plurality of support bars may include a first part that faces the display module; a second part below the first part and having a size less than a size of the first part; and a third part that extends from the first part toward the second part. The third part may have a width in the first direction less than a width in the first direction of each of the first and second parts.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF EMBODIMENTS

Figure 1:
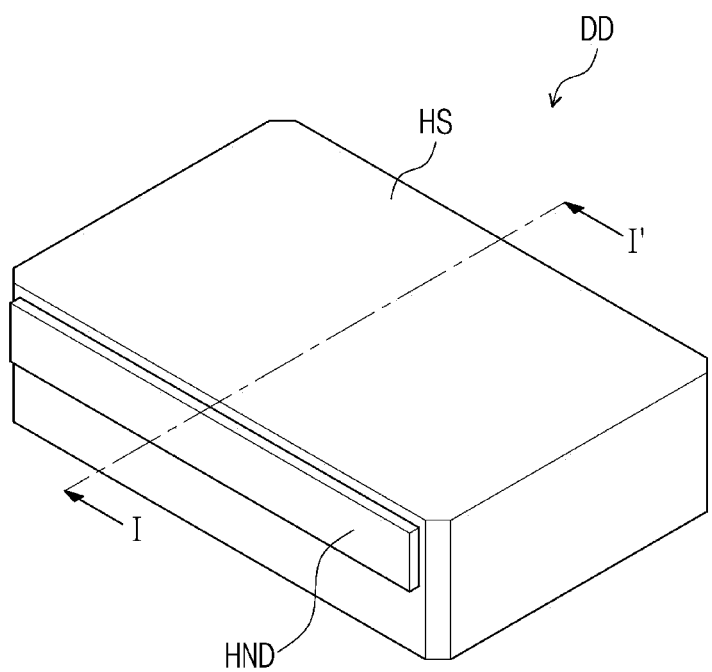
FIG. 1 illustrates a schematic perspective view showing a display device according to an embodiment of the disclosure.
Figure 1:
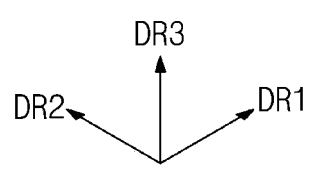

In this description, when a certain component (or region, layer, portion, etc.) is referred to as being "on," "connected to," or "coupled to" other component(s), the certain component may be directly on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents. The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the disclosure. Unless the context clearly indicates otherwise, the singular forms are intended to include the plural forms as well.

In addition, the terms "beneath," "lower," "above," "upper," and the like are used herein to describe one component's relationship to other component(s) illustrated in the drawings. The relative terms are intended to encompass different orientations in addition to the orientation depicted in the drawings.

It should be understood that the terms "comprise," "include," "have," and the like are used to specify the presence of stated features, integers, steps, operations, components, elements, or combinations thereof, but do not preclude the presence or addition of one or more other features, integers, steps, operations, components, elements, or combinations thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The following will now describe in detail some embodiments of the disclosure in conjunction with the accompanying drawings.

Figure 2:
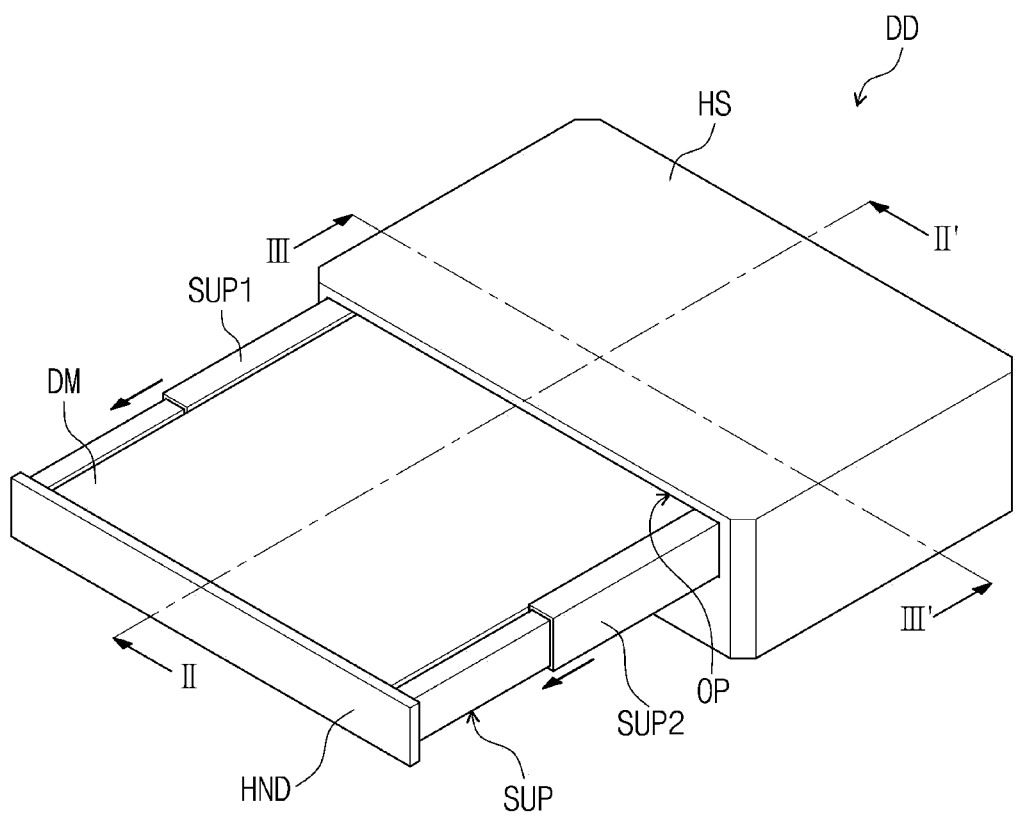
FIG. 2 illustrates a schematic perspective view showing a display module withdrawn from a housing depicted in FIG. 1.

FIG. 1 illustrates a schematic perspective view showing a display device according to an embodiment. FIG. 2 illustrates a schematic perspective view showing a display module withdrawn from a housing depicted in FIG. 1.

Referring to FIGS. 1 and 2, a display device DD according to an embodiment may include a housing HS, a display module DM accommodated in the housing HS, a handle HND connected to the display module DM, and a supporter SUP adjacent to opposite sides of the display module DM.

The housing HS may have a hexahedral shape, but no limitation is imposed on the shape of the housing HS. The housing HS may be elongated more in a second direction DR2 than in a first direction DR1 that intersects the second direction DR2.

A third direction DR3 is defined hereinafter as a direction that substantially vertically intersects a plane formed by the first and second directions DR1 and DR2. In this description, the phrase "when viewed in plan" or "in a plan view" may mean that "when viewed in the third direction DR3."

The housing HS may have an opening OP on one of both sides of the housing HS that are opposite to each other in the first direction DR1. The opening OP may be closer to an upper portion of the housing HS than to a lower portion of the housing HS.

The display module DM may be wrapped around a roller disposed in the housing HS and may be introduced (or inserted) or withdrawn through the opening OP. The disclosure, however, is not limited thereto, and the housing HS may be configured such that the display module DM may be slidably withdrawn without using a roller. The following will discuss in detail the configuration in which the display module DM is wrapped around a roller.

The handle HND may be disposed outside the housing HS and adjacent to the opening OP. The handle HND may be close to the upper portion of the housing HS. The handle HND may move in the first direction DR1. In case that the handle HND moves in the first direction DR1 away from the housing HS, the display module DM may be withdrawn through the opening OP from the housing HS. The handle HND may be manipulated or operated by users.

As shown in FIG. 1, a closed mode may be defined to indicate a state in which the display module DM is disposed inside the housing HS and thus is not externally exposed. As shown in FIG. 2, an open mode may be defined to indicate a state in which the display module DM is externally exposed outside the housing HS. In the open mode, an exposed portion of the display module DM may be expanded.

The display module DM may be supported by the supporter SUP that is disposed on both sides of the display module DM that are opposite to each other in the second direction DR2. This configuration will be further discussed in detail below. The supporter SUP may include a first supporter SUP1 adjacent to one side (or first side) of the display module DM and a second supporter SUP2 adjacent to another side of the display module DM. The one side and another side (or second side) of the display module DM may be the both sides of the display module DM that are opposite to each other in the second direction DR2.

Figure 3:
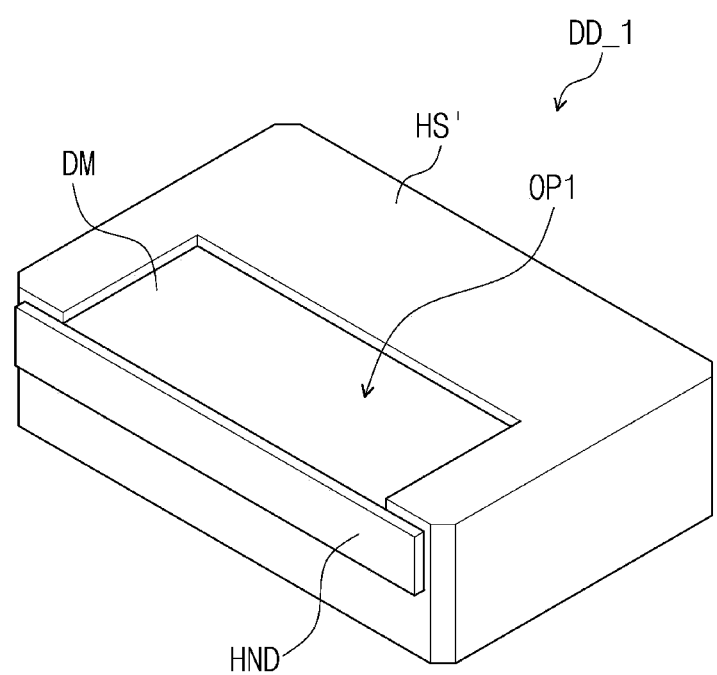
FIGS. 3 and 4 illustrate schematic perspective views showing a display device according to an embodiment of the disclosure.
Figure 3:
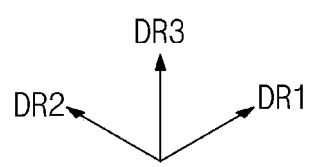
Figure 4:
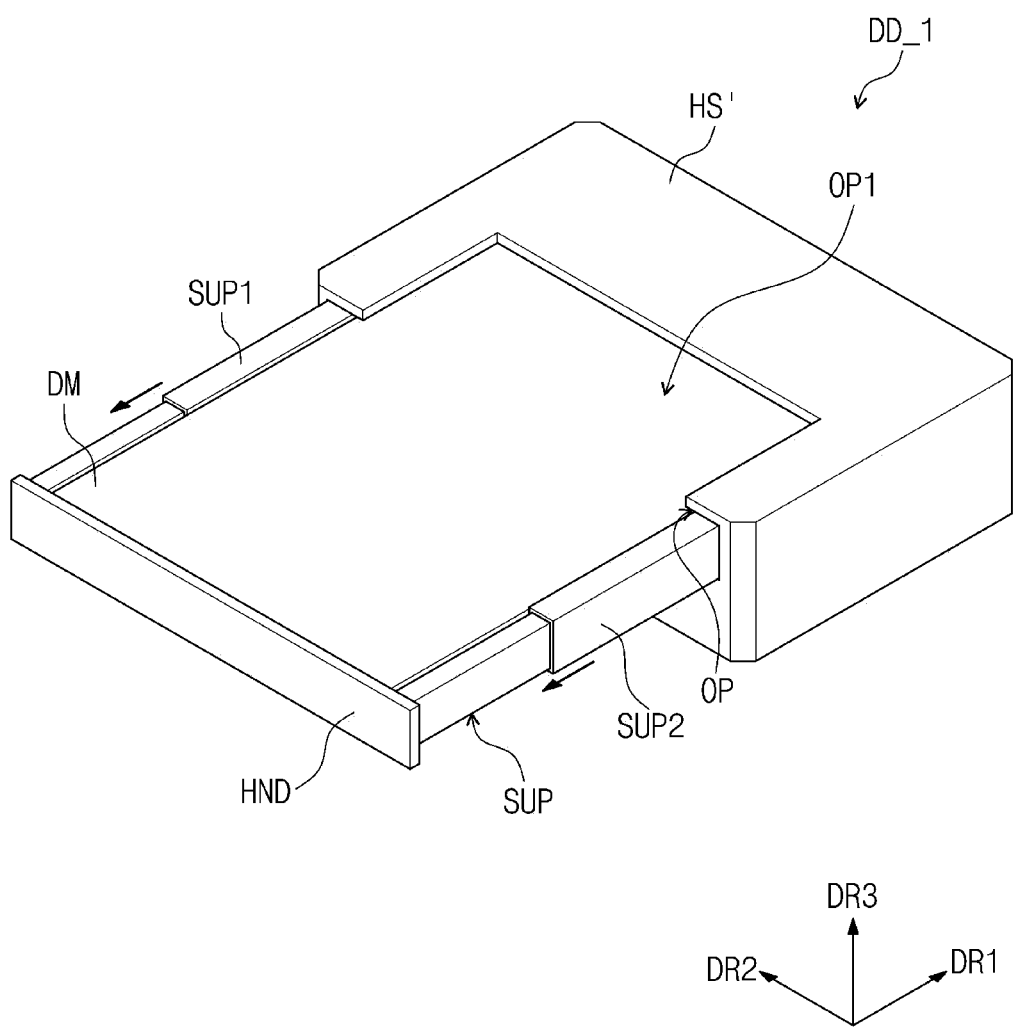

FIGS. 3 and 4 illustrate schematic perspective views showing a display device according to an embodiment.

Except a housing HS', a display device DD_1 shown in FIGS. 3 and 4 may be configured identically to the display device DD shown in FIGS. 1 and 2. Thus, the following description will focus on a configuration of the housing HS'.

Referring to FIGS. 3 and 4, the housing HS' may have, on a top surface thereof, a first opening OP1 that is defined to expose a portion of the display module DM. The first opening OP1 may be adjacent to the handle HND. The first opening OP1 may be defined continuously from the opening OP through which the display module DM is inserted and withdrawn.

The display module DM may display an image on a portion that is exposed through the first opening OP1. The display device DD shown in FIG. 1 may not externally expose the display module DM disposed in the housing HS, but in contrast, the display device DD_1 shown in FIG. 3 may externally expose a portion of the display module DM. In case that the handle HND moves in the first direction DR1 away from the housing HS', the exposed portion of the display module DM may be expanded.

Figure 5:
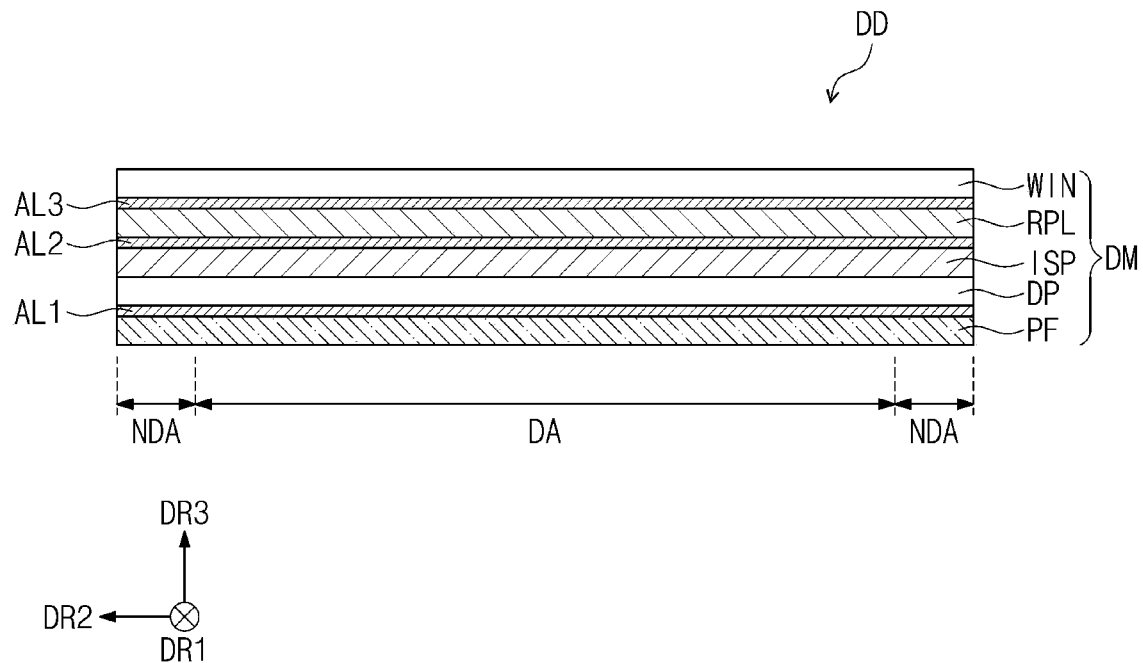
FIG. 5 illustrates a schematic cross-sectional view showing an example of the display module depicted in FIG. 2.

FIG. 5 illustrates a schematic cross-sectional view illustrating an example of the display module depicted in FIG. 2.

FIG. 5 shows by way of example a cross-section of the display device DD when viewed in the first direction DR1.

Referring to FIG. 5, the display device DD may include the display module DM. Although not shown in FIG. 5, the display device DD may include a module supporter disposed below the display module DM, and a configuration of the module supporter will be illustrated in FIG. 8 below.

The display module DM may include a display panel DP, an input sensing part ISP, an antireflection layer RPL, a window WIN, a panel protection film PF, and first to third adhesive layers AL1 to AL3.

The display panel DP may be a flexible display panel. The display panel DP according to an embodiment may be an emissive display panel, but the disclosure is not particularly limited thereto. For example, the display panel DP may be an organic light emitting display panel or an inorganic light emitting display panel. An emission layer of the organic light emitting display panel may include an organic light emitting material. An emission layer of the inorganic light emitting display panel may include a quantum-dot or a quantum-rod.

The input sensing part ISP may be disposed on the display panel DP. The input sensing part ISP may include sensors (not shown) that use a capacitance method to detect an external input. The input sensing part ISP may be directly fabricated on the display panel DP during its fabrication. The disclosure, however, is not limited thereto, and when the display panel DP is manufactured, the input sensing part ISP may be separately fabricated (or manufactured) in the form of a panel and then attached to the display panel DP through an adhesive.

The antireflection layer RPL may be disposed on the input sensing part ISP. The antireflection layer RPL may be defined as a film for preventing reflection of external light. The antireflection layer RPL may reduce a reflectance of external light that is incident onto the display panel DP from outside the display device DD.

In case that a user is provided with external light that travels toward and is reflected from the display panel DP, as a mirror effect, the external light may be visible to the user. To prevent this effect, the antireflection layer RPL may include color filters that display the same colors as those generated from pixels of the display panel DP.

The color filters may be configured such that the external light is filtered into the same colors as those generated from the pixels. In this case, the external light may not be visible to users. The disclosure, however, is not limited thereto, and the antireflection layer RPL may include one or more of a retarder and a polarizer to reduce a reflectance of external light.

The window WIN may be disposed on the antireflection layer RPL. The window WIN may protect the display panel DP, the input sensing part ISP, and the antireflection layer RPL against external scratches and impacts.

The panel protection film PF may be disposed below the display panel DP. The panel protection film PF may protect a lower portion of the display panel DP. The panel protection film PF may include a flexible plastic material such as polyethylene terephthalate (PET).

The first adhesive layer AL1 may be disposed between the display panel DP and the panel protection film PF. The first adhesive layer AL1 may attach the display panel DP and the panel protection film PF to each other. The disclosure, however, is not limited thereto, and the panel protection film PF may be directly formed below the display panel DP.

The second adhesive layer AL2 may be disposed between the antireflection layer RPL and the input sensing part ISP. The second adhesive layer AL2 may attach the antireflection layer RPL and the input sensing part ISP to each other. The disclosure, however, is not limited thereto, and the antireflection layer RPL may be directly formed on the input sensing part ISP.

The third adhesive layer AL3 may be disposed between the window WIN and the antireflection layer RPL. The third adhesive layer AL3 may attach the window WIN and the antireflection layer RPL to each other. The disclosure, however, is not limited thereto, and the window WIN may be directly formed on the antireflection layer RPL.

Figure 6:
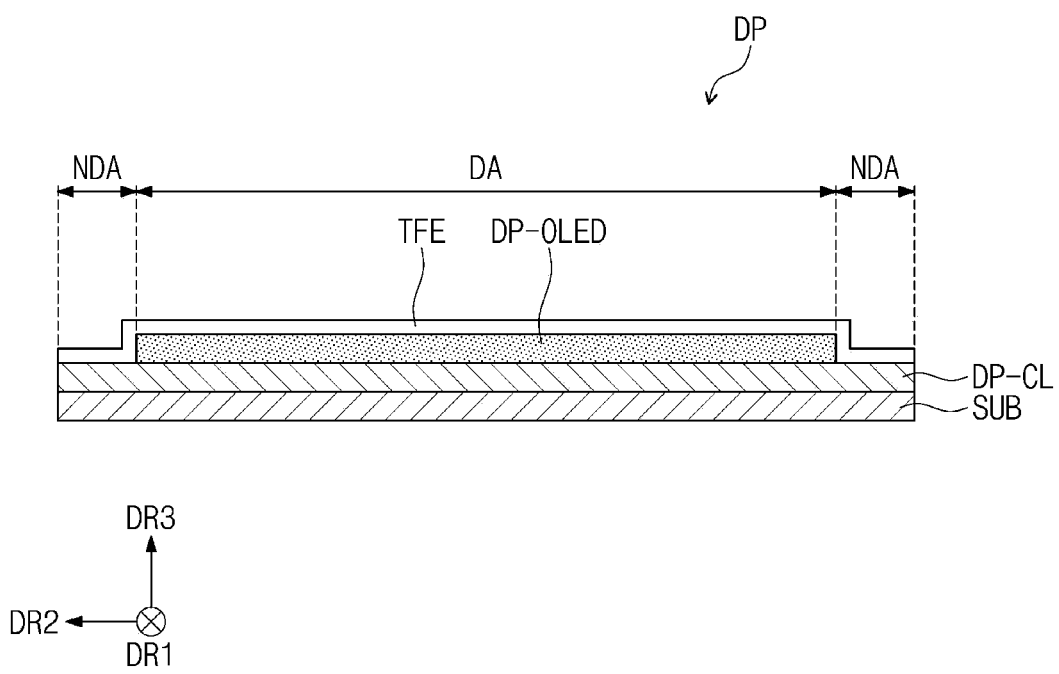
FIG. 6 illustrates a schematic cross-sectional view showing an example of a display panel depicted in FIG. 5.

FIG. 6 illustrates a schematic cross-sectional view showing an example of the display panel depicted in FIG. 5.

FIG. 6 illustrates by way of example a cross-section of the display panel DP when viewed in the first direction DR1.

Referring to FIG. 6, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. The substrate SUB may include a flexible plastic material such as polyimide (PI). The display element layer DP-OLED may be disposed in the display region DA.

Pixels may be disposed in the display region DA. Each of the pixels may include a light emitting element that is disposed on the display element layer DP-OLED and is electrically connected to a transistor placed on the circuit element layer DP-CL.

The thin-film encapsulation layer TFE may be disposed on the circuit element layer DP-CL so as to cover the display element layer DP-OLED. The thin-film encapsulation layer TFE may include inorganic layers and an organic layer between the inorganic layers. The inorganic layers may protect the pixels against moisture and/or oxygen. The organic layer may protect the pixels against foreign substances such as dust particles.

Figure 7:
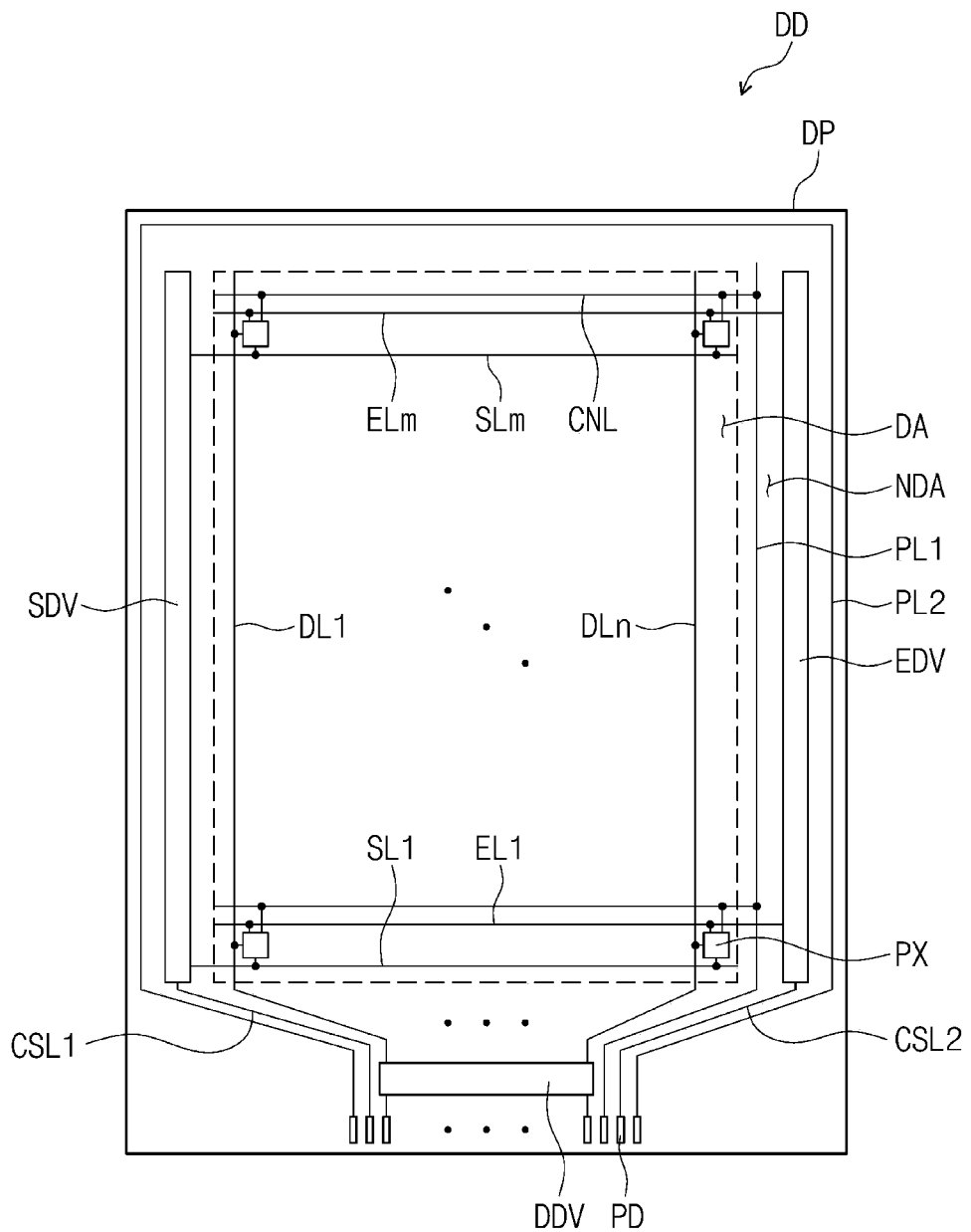
FIG. 7 illustrates a schematic plan view showing the display panel depicted in FIG. 6.

FIG. 7 illustrates a schematic plan view showing the display panel depicted in FIG. 6.

Referring to FIG. 7, the display device DD may include a display panel DP, a scan driver SDV, a data driver DDV, an emission driver EDV, and pads PD. The display panel DP may include a display region DA and a non-display region NDA that surrounds the display region DA.

The display panel DP may include pixels PX, scan lines SL1 to SLm, data lines DL1 to DLn, emission lines EL1 to ELm, first and second control lines CSL1 and CSL2, first and second power lines PL1 and PL2, and connection lines CNL. The subscripts "m" and "n" are natural numbers.

The pixels PX may be disposed in the display region DA. The scan driver SDV and the emission driver EDV may be disposed in the non-display region NDA adjacent to long sides of the display panel DP that extend in the first direction DR1.

The data driver DDV may be disposed in the non-display region NDA adjacent to one of short sides of the display panel DP that extend in the second direction DR2. In a plan view, the data driver DDV may be adjacent to a lower end of the display panel DP.

The scan lines SL1 to SLm may extend in the second direction DR2 to be electrically connected to the pixels PX and the scan driver SDV. The data lines DL1 to DLn may extend in the first direction DR1 to be electrically connected to the pixels PX and the data driver DDV. The emission lines EL1 to ELm may extend in the second direction DR2 to be electrically connected to the pixels PX and the emission driver EDV.

The first power line PL1 may extend in the first direction DR1 to be disposed in the non-display region NDA. The first power line PL1 may be disposed between the display region DA and the emission driver EDV or between the display region DA and the scan driver SDV, but the disclosure is not limited thereto.

The connection lines CNL may extend in the second direction DR2 and may be arranged in the first direction DR1. The connection lines CNL may be electrically connected to the first power line PL1 and the pixels PX. The pixels PX may be supplied with a first voltage though the first power line PL1 and the connection lines CNL electrically connected to the first power line PL1.

The second power line PL2 may be disposed in the non-display region NDA. The second power line PL2 may extend along the long sides of the display panel DP and along the short side around which the data driver DDV is not disposed. The second power line PL2 may be disposed outward more than the scan driver SDV and the emission driver EDV.

Although not shown in the drawings, the second power line PL2 may extend toward the display region DA to be electrically connected to the pixels PX. The second power line PL2 may supply the pixels PX with a second voltage less than the first voltage.

The first control line CSL1 may be electrically connected to the scan driver SDV and may extend toward the lower end of the display panel DP in a plan view. The second control line CSL2 may be electrically connected to the emission driver EDV and may extend toward the lower end of the display panel DP in a plan view. The data driver DDV may be disposed between the first control line CSL1 and the second control line CSL2.

The pads PD may be disposed on the display panel DP. The pads PD may be closer than the data driver DDV to the lower end of the display panel DP. The pads PD may be electrically connected to the data driver DDV, the first power line PL1, the second power line PL2, the first control line CSL1, and the second control line CSL2. The data lines DL1 to DLn may be electrically connected to the data driver DDV, and the data driver DDV may be electrically connected to the pads PD that correspond to the data lines DL1 to DLn.

Although not shown in the drawings, the display device DD may further include a timing controller (not shown) that controls operations of the scan driver SDV, the data driver DDV, and the emission driver EDV, and may further include a voltage generator that produce first and second voltages. The timing controller and the voltage generator may be electrically connected through a printed circuit board to the pads PD.

The scan driver SDV may generate scan signals, and the scan signals may be applied through the scan lines SL1 to SLm to the pixels PX. The data driver DDV may generate data voltages, and the data voltages may be applied through the data lines DL1 to DLn to the pixels PX. The emission driver EDV may generate light emission signals, and the light emission signals may be applied through the emission lines EL1 to ELm to the pixels PX.

In response to the scan signals, the data voltages may be provided to the pixels PX. In response to the emission signals, the pixels PX may emit light whose brightness corresponds to the data voltages, thereby displaying an image. The emission signals may control light emission timing of the pixels PX.

Figure 8:
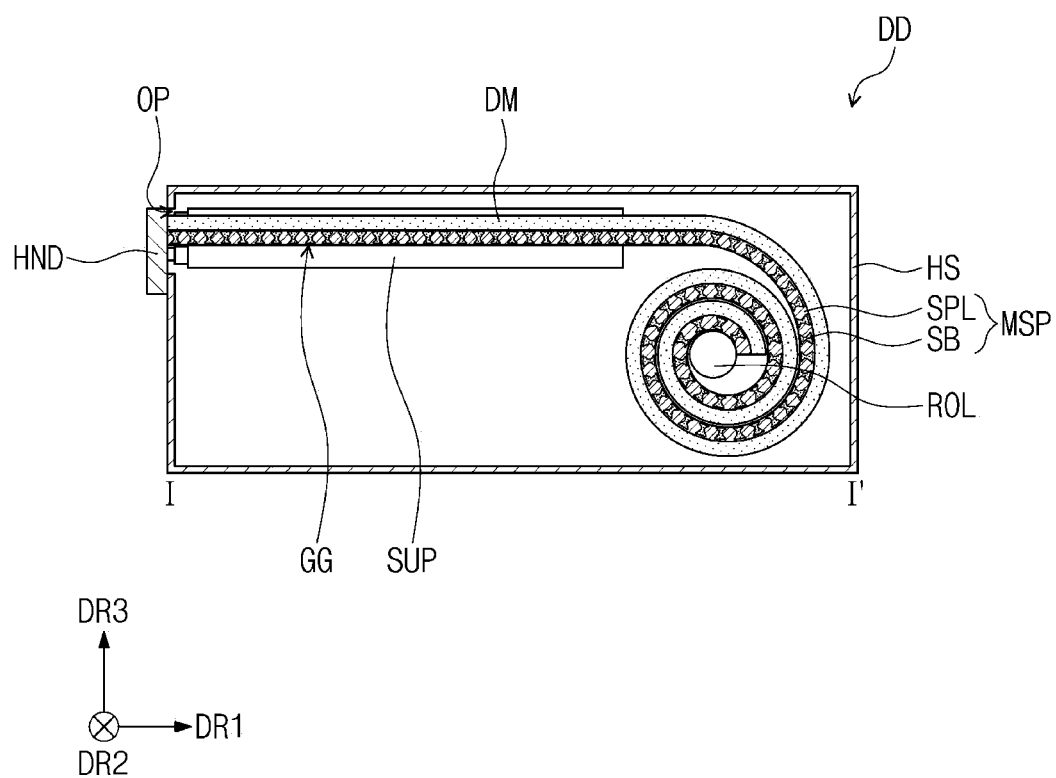
FIG. 8 illustrates a schematic cross-sectional view taken along line I-I' of FIG. 1.
Figure 9:
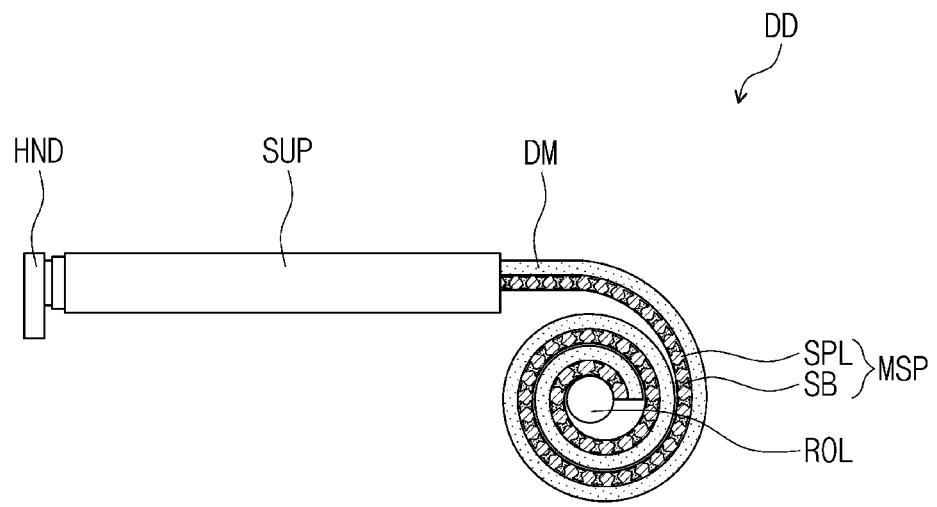
FIG. 9 illustrates a schematic side view, seen in a second direction, showing an inside of a housing depicted in FIG. 1.
Figure 9:
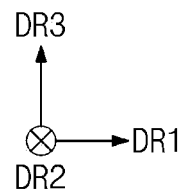

FIG. 8 illustrates a schematic cross-sectional view taken along line I-I' of FIG. 1. FIG. 9 illustrates a schematic side view, seen in the second direction, illustrating an inside of the housing depicted in FIG. 1.

In FIG. 9, the housing HS is omitted for convenience of description.

Referring to FIGS. 8 and 9, the display device DD may include a housing HS, a display module DM, a roller ROL, a module supporter MSP, a supporter SUP, and a handle HND. The housing HS may accommodate the display module DM, the roller ROL, the module supporter MSP, and the supporter SUP.

The housing HS may have an opening OP defined on one side t (or first side) hereof and may also have therein the roller ROL adjacent to another side (or second side) that is opposite to the one side on which the opening OP is defined. When viewed in the second direction DR2, the roller ROL may have a circular shape. For example, the roller ROL may have a cylindrical shape that extends in the second direction DR2. The roller ROL may rotate in a clockwise or counterclockwise direction. Although no shown in the drawings, the display device DD may further include a driver to rotate the roller ROL.

The display module DM may extend in the first direction DR1 and may be wrapped around the roller ROL. One end (or first end) of the display module DM may be connected to the roller ROL. A portion of the display module DM may be wrapped around the roller ROL, and another portion of the display module DM may be disposed to overlap the supporter SUP without being wrapped around the roller ROL. The display module DM may have another end (or second end) opposite to the one end of the display module DM, and the another end of the display module DM may be connected to the handle HND. The another end of the display module DM may be adjacent to the opening OP.

A front surface of the display module DM may be defined as a surface on which an image is displayed. The module supporter MSP may be disposed below and support the display module DM. The display module DM may have a rear surface opposite to the front surface of the display module DM, and the module supporter MSP may be attached to the rear surface of the display module DM. For example, the module supporter MSP may be attached through a pressure sensitive adhesive to the rear surface of the display module DM.

The module supporter MSP may extend in the first direction DR1 and may be wrapped around the roller ROL. An end of the module supporter MSP may be connected to the roller ROL, and another end of the module supporter MSP may be connected to the handle HND. The another end of the module supporter MSP may be adjacent to the opening OP. A portion of the module supporter MSP may be wrapped around the roller ROL, and another portion of the module supporter MSP may be disposed to overlap the supporter SUP without being wrapped around the roller ROL.

The module supporter MSP may include a support layer SPL that is disposed below the display module DM and extends in the first direction DR1, and support bars SB that are disposed in the support layer SPL and are arranged in the first direction DR1.

One end (or first end) of the support layer SPL may be connected to the roller ROL, and another end (and second end) of the support layer SPL may be connected to the handle HND. The another end of the support layer SPL may be adjacent to the opening OP. A portion of the support layer SPL may be wrapped around the roller ROL, and another portion of the support layer SPL may be disposed to overlap the supporter SUP without being wrapped around the roller ROL.

When viewed in the second direction DR2, the support bars SB may each have a dumbbell shape. A detailed structure of the support bar SB will be further discussed in detail below.

The display module DM and the module supporter MSP may be inserted or withdrawn through the opening OP. An end of the supporter SUP may be connected to the handle HND. Identical or similar to an antenna, the supporter SUP may expand in the first direction DR1. This configuration will be further discussed in detail below.

A guide groove GG may be defined on the supporter SUP. The module supporter MSP may be disposed in the guide groove GG and may move in the first direction DR1 along the guide groove GG. The module supporter MSP may be disposed in the guide groove GG and may be supported by the supporter SUP, and the module supporter MSP may support the display module DM. For example, the supporter SUP may substantially support the display module DM.

Figure 10:
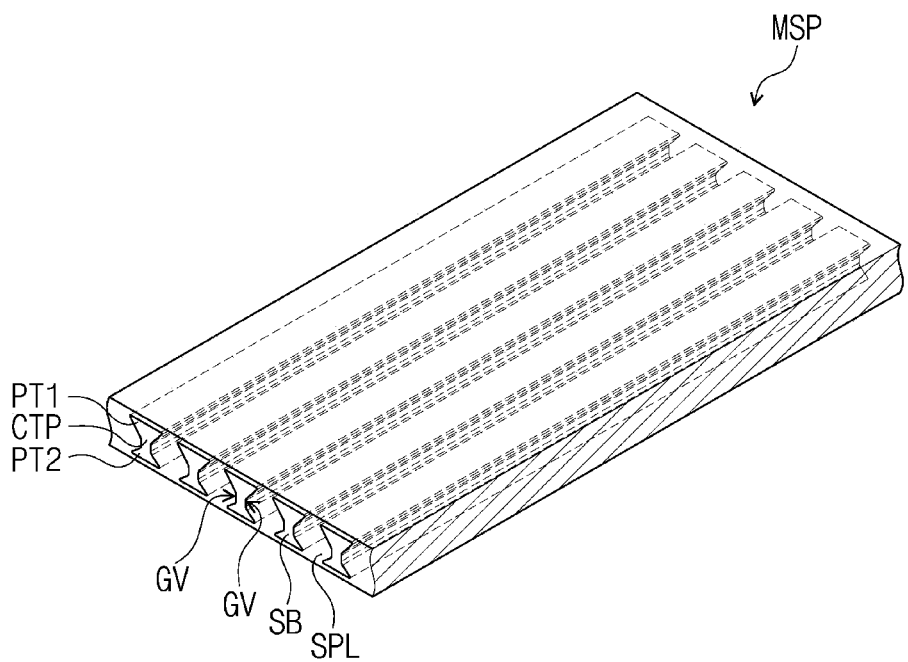
FIG. 10 illustrates a schematic perspective view partially showing a module supporter depicted in FIG. 9.
Figure 10:
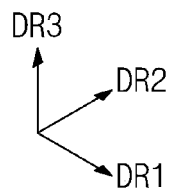
Figure 11:
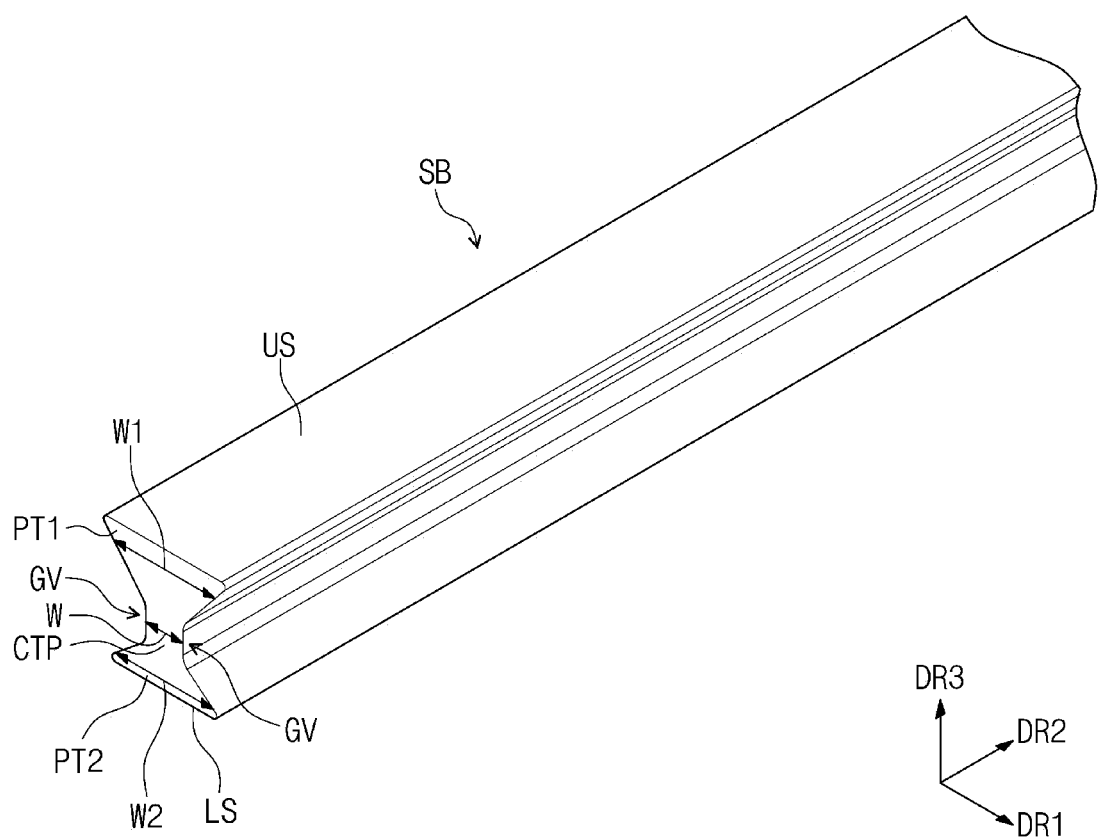
FIG. 11 illustrates a schematic perspective view showing a support bar depicted in FIG. 10.
Figure 12A:
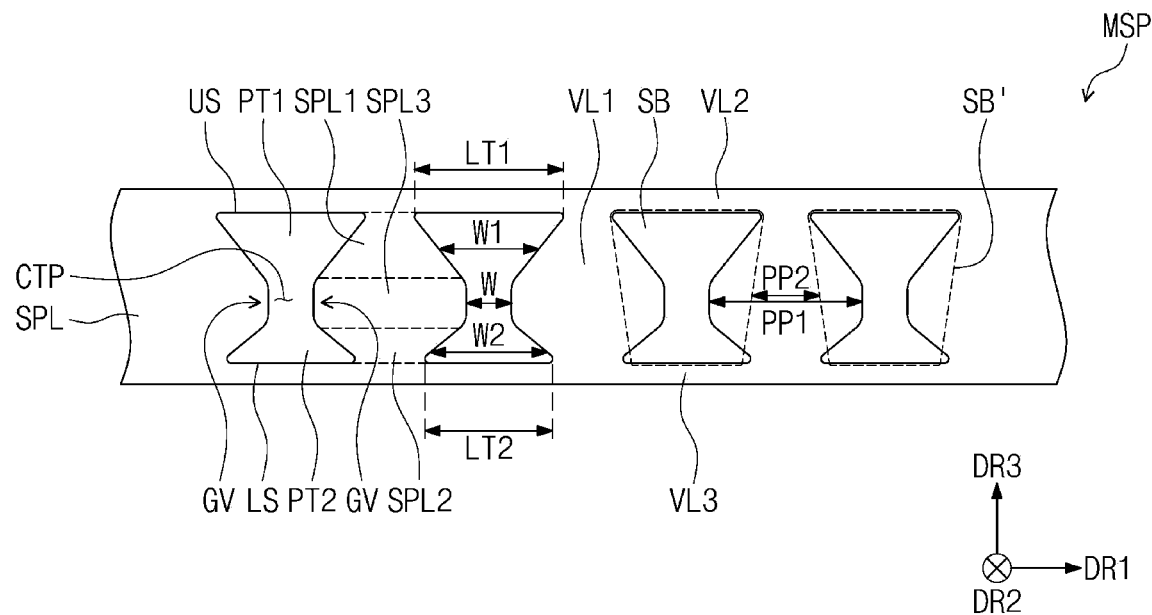
FIG. 12A illustrates a schematic side view, seen in a second direction, showing the module supporter depicted in FIG. 10.
Figure 12B:
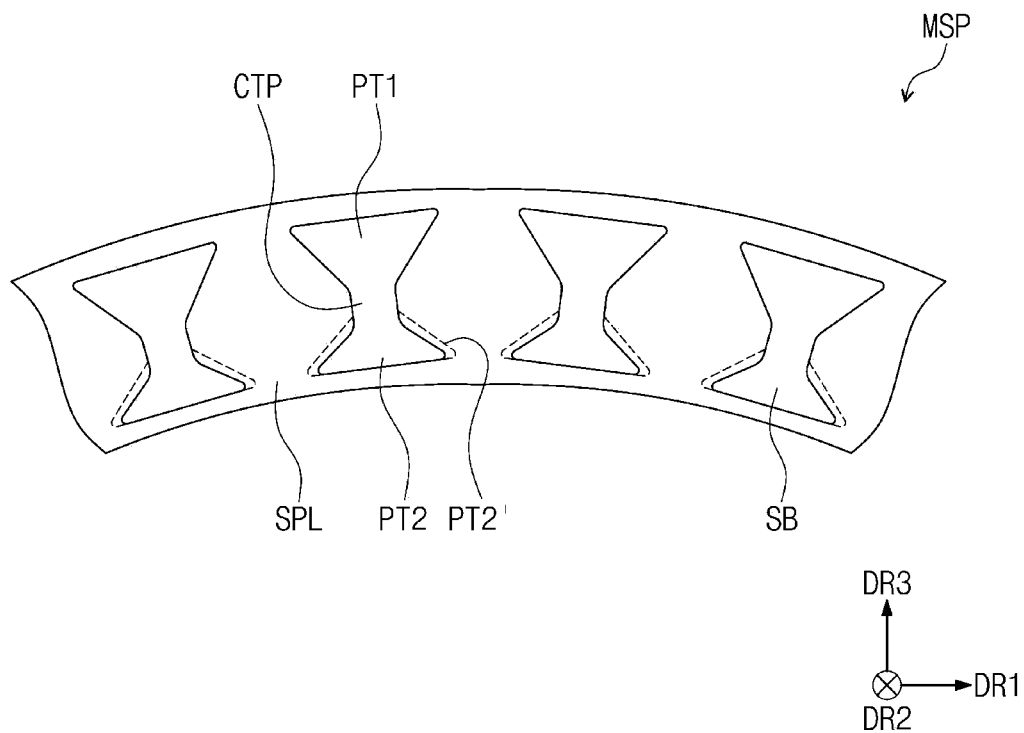
FIG. 12B illustrates a schematic side view showing a bending state of the module supporter depicted in FIG. 12A.

FIG. 10 illustrates a schematic perspective view partially showing the module supporter depicted in FIG. 9. FIG. 11 illustrates a schematic perspective view showing a support bar depicted in FIG. 10. FIG. 12A illustrates a schematic side view, seen in the second direction, showing the module supporter depicted in FIG. 10. FIG. 12B illustrates a schematic side view showing a bent state of the module supporter depicted in FIG. 12A.

FIG. 8 will also be described below, as needed.

Referring to FIGS. 8, 10, 11, and 12A, the support bars SB disposed in the support layer SPL may extend in the second direction DR2 and may be arranged in the first direction DR1. FIG. 10 depicts, by way of example, dotted lines that indicate the support bars SB disposed in the support layer SPL.

The support bars SB may be spaced apart from each other at regular intervals in the first direction DR1, but the intervals between the support bars SB are not limited thereto. The support bars SB may each have both ends that are opposite to each other in the second direction DR2, and the both ends of each support bar SB may be externally exposed outside the support layer SPL.

The support bars SB may be of rigid types. For example, the support bars SB may include metal. The support bars SB may include aluminum, stainless, or Invar. The support bars SB may include a metal that can be attracted to a magnet.

The support layer SPL may include a resilient elastomeric polymer. For example, the support layer SPL may include at least one selected from thermoplastic polyurethane, silicone, thermoplastic rubber, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomer, and ethylene-vinyl acetate.

The support bars SB may each have a modulus greater than that of the support layer SPL. The support layer SPL may have a modulus of about 20 KPa to about 20 MPa. The support bars SB may each have a modulus of about 1 GPa to about 200 GPa.

The display module DM may be supported by the support bars SB that are attached to the rear surface of the display module DM, without the support layer SPL. In this configuration, in case that the display module DM is repeatedly rolled and unrolled, the display module DM may be deformed in a space between the support bars SB. For example, the display module DM may have a downwardly extending deformation at its portion that overlaps the space between the support bars SB, and this deformation may be externally visible as a wrinkle shape. In this sense, the surface quality of the display module DM may decrease.

The support bars SB having rigidity may stably support the display module DM, and the support layer SPL having elasticity may provide a flat top surface to the display module DM. As the display module DM is attached to the flat top surface of the support layer SPL, the display module DM may be kept flat without being deformed at its portion that overlaps the space between the support bars SB. Therefore, the display module DM may improve in surface quality.

The support bar SB may have a groove GV on each of both lateral surfaces that are opposite to each other in the first direction DR1. The support layer SPL may be disposed to fill the grooves GV of each of the support bars SB.

The support bars SB may have the same shape, and thus the following will describe a configuration of a support bar SB defined as a k-th support bar SB.

The groove GV may be defined on each of both lateral surfaces of the k-th support bar SB. The word k is a natural number. The grooves GV defined on both the lateral surfaces of the k-th support bar SB may extend in the second direction DR2. The disclosure, however, is not limited thereto, and the k-th support bar SB may have, on its both lateral surfaces, dot-shaped grooves GV that are arranged in the second direction DR2. The grooves GV may be defined recessed inward both lateral surfaces of the k-th support bar SB.

The k-th support bar SB may include a first part PT1 that faces the display module DM, a second part PT2 disposed below the first part PT1, and a third part CTP between the first part PT1 and the second part PT2. The third part CTP may be defined as a central part. The third part CTP may have a width W in the first direction DR1 less than a width W1 in the first direction DR1 of the first part PT1 and a width W2 in the first direction DR1 of the second part PT2. The first part PT1, the second part PT2, and the third part CTP may define the grooves GV, and thus the k-th support bar SB may have a dumbbell shape.

The first part PT1 facing the display module DM may have a flat top surface US. The second part PT2 opposite to the display module DM may have a flat bottom surface LS. The third part CTP may extend in the third direction DR3. The third part CTP may have a constant width and may extend from the first part PT1 to the second part PT2.

Referring to FIG. 12A, the width W1 in the first direction DR1 of the first part PT1 may increase in an upward direction toward the display module DM. The width W2 in the first direction DR1 of the second part PT2 may increase in a downward direction away from the display module DM.

The first part PT1 may have a size greater than that of the second part PT2. When viewed in the second direction DR2, the first part PT1 may have an area greater than that of the second part PT2. A length LT1 in the first direction DR1 of the top surface US of the first part PT1 may be greater than a length LT2 in the first direction DR1 of the bottom surface LS of the second part PT2.

A first volume VL1 of the support layer SPL between the grooves GV of the support bars SB that are adjacent to each other may be greater than a second volume VL2 of the support layer SPL on each of the support bars SB and a third volume VL3 of the support layer SPL below each of the support bars SB. The second volume VL2 may be different from the third volume VL3, but the disclosure is not limited thereto, and the second volume VL2 may be the same as the third volume VL3.

The support layer SPL between support bars SB that are adjacent to each other may include a first support layer SPL1, a second support layer SPL2, and a third support layer SPL3. The first support layer SPL1 may be disposed between the first parts PT1 of the support bars SB that are adjacent to each other. The second support layer SPL2 may be disposed between the second parts PT2 of the support bars SB that are adjacent to each other. The third support layer SPL3 may be disposed between the third parts CTP of the support bars SB that are adjacent to each other.

A relationship between widths in the first direction DR1 of the first, second, and third support layers SPL1, SPL2, and SPL3 may be opposite to that between the widths W1, W2, and W in the first direction DR1 of the first, second, and third parts PT1, PT2, and PT3. For example, the width in the first direction DR1 of the third support layer SPL3 may be greater than that in the first direction DR1 of the first support layer SPL1 and that in the first direction DR1 of the second support layer SPL2. The width in the first direction DR1 of the first support layer SPL1 may decrease in an upward direction. The width in the first direction DR1 of the second support layer SPL2 may decrease in a downward direction. In case that support bars SB' have their inverted trapezoidal shapes as illustrated by dotted lines, the support bars SB' may have increased weights. In an embodiment, the supports bars SB may have their dumbbell shapes, and thus the support bars SB may have their weights less than those of the support base SB' having inverted trapezoidal shapes.

Compared to the support bars SB' having inverted trapezoidal shapes, the dumbbell-shaped support bars SB may have increased surface areas. The support bars SB may be disposed in and attached to the support layer SPL. As the support bars SB have increased surface areas, contact areas and adhesive forces may be increased between the support bars SB and the support layer SPL.

As the support bars SB have dumbbell shapes, the support layer SPL may increase in a size of a part PP1 disposed between the grooves GV of the support bars SB. For example, a size of the part PP1 of the support layer SPL between the support bars SB having dumbbell shapes may be greater than that of a part PP2 of the support layer SPL between the support bars SB' having inverted trapezoidal shapes.

An external pressure may be applied downward to the support layer SPL. The support bars SB may be bent downward by the external pressure transmitted to the support bars SB. Because the part PP1 of the support layer SPL between the support bars SB is larger than the part PP2 of the support layer SPL between the support bars SB', the part PP1 of the support layer SPL may allow the support bars SB to have an increased supporting force against the external pressure. For example, the support bars SB may be supported by the part PP1 of the support layer SPL and may thus be less bent downwardly.

Referring to FIG. 12B, the module supporter MSP may be bent and wrapped around the roller ROL. A bottom surface of the module supporter MSP may be concavely bent, and the second parts PT2 adjacent to the bottom surface of the module supporter MSP may approach close to each other.

In an embodiment, as illustrated by dotted lines, second parts PT2' and the first parts PT1 of the support bars SB may have the same size. In case that the module supporter MSP is bent, the second parts PT2' may be located near each other. In this case, an increased stress may be generated due to interference that occurs between neighboring second parts PT2'. Therefore, the module supporter MSP may not be readily bent.

In an embodiment, the second parts PT2 may have sizes less than those of the first parts PT1. In this case, in case that the module supporter MSP is bent, an interval between neighboring second parts PT2 may be greater than that between neighboring second parts PT2'. Thus, neighboring second parts PT2 may have reduced interference therebetween. As a result, the module supporter MSP may be easy to bend.

Figure 13:
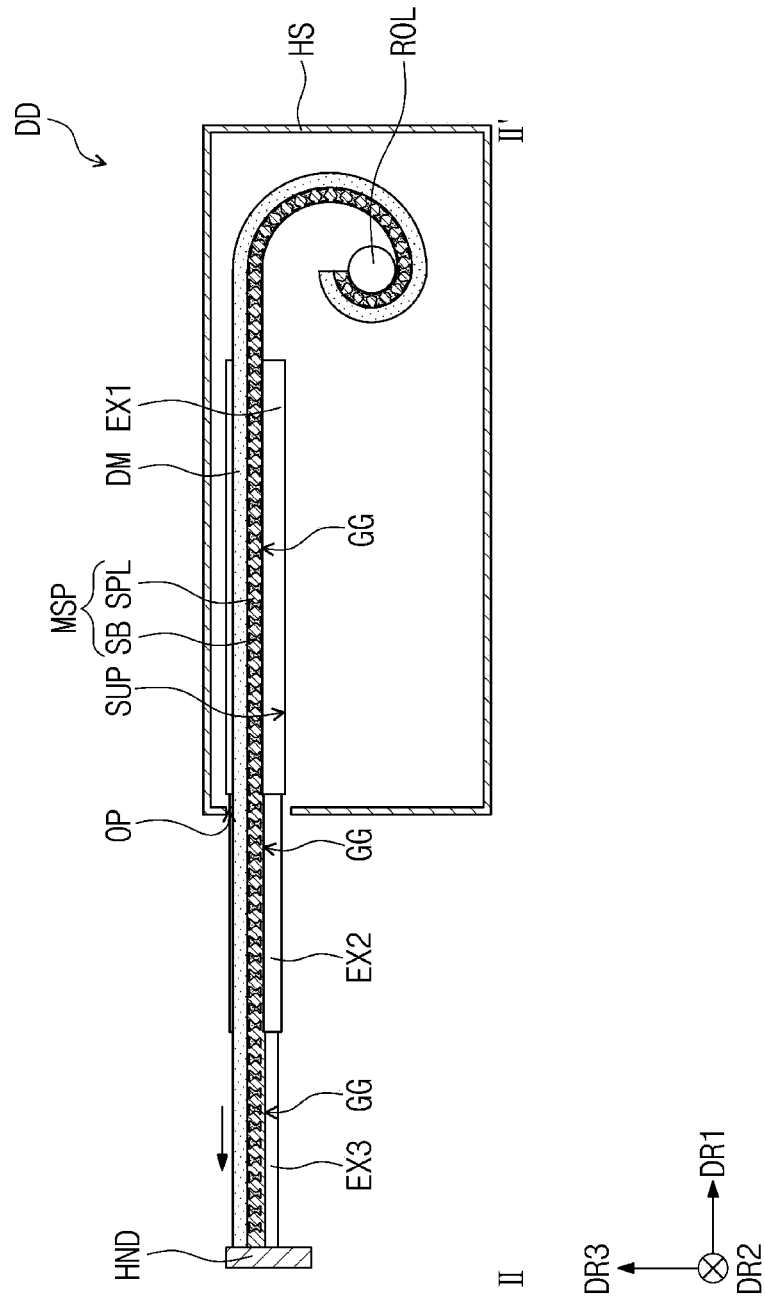
FIG. 13 illustrates a schematic cross-sectional view taken along line II-IF of FIG. 2.
Figure 14:
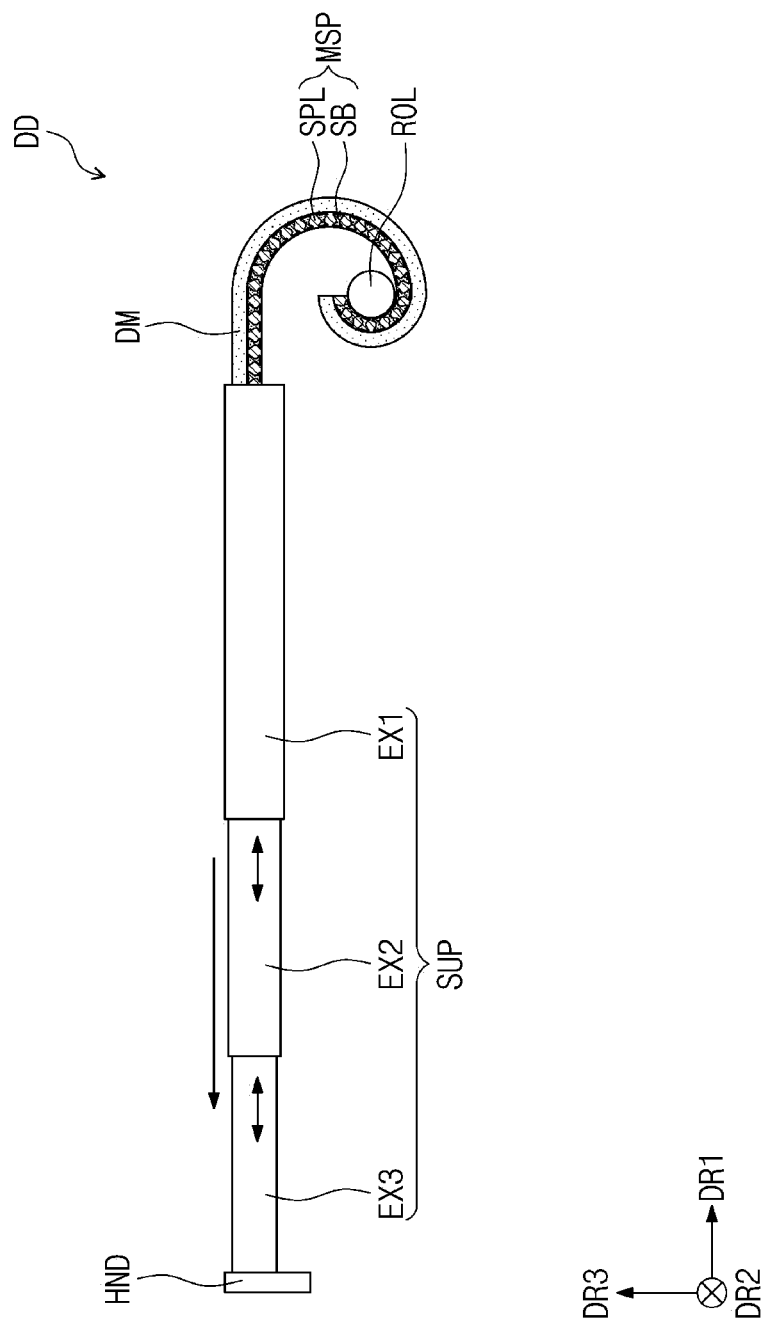
FIG. 14 illustrates a schematic side view, seen in a second direction, showing an inside of a housing depicted in FIG. 2.

FIG. 13 illustrates a schematic cross-sectional view taken along line II-IF of FIG. 2. FIG. 14 illustrates a schematic side view, seen in the second direction, illustrating an inside of the housing depicted in FIG. 2.

In FIG. 14, the housing HS is omitted for convenience of description.

Referring to FIGS. 13 and 14, the handle HND may move in the first direction DR1 away from the housing HS. In accordance with the movement of the handle HND, the module supporter MSP and the display module DM connected to the handle HND may move in the first direction DR1.

The display module DM and the module supporter MSP may be released from the roller ROL, and the released display module DM and the module supporter MSP may be withdrawn through the opening OP from the housing HS. Therefore, an exposed portion of the display module DM may be expanded.

In case that the display module DM and the module supporter MSP are withdrawn from the housing HS, the supporter SUP connected to the handle HND may be externally expanded through the opening OP from the housing HS in accordance with the movement of the handle HND. The supporter SUP may be externally expanded from the housing HS to support the display module DM outside the housing HS.

The supporter SUP may support the module supporter MSP driven outward from the housing HS, and the module supporter MSP supported by the supporter SUP may support the display module DM.

The supporter SUP may include a first extension EX1, a second extension EX2, and a third extension EX3 to expand outwardly from the housing HS. The second extension EX2 may be disposed between the first extension EX1 and the third extension EX3.

To achieve an expandable structure such as that of an antenna, the second extension EX2 may be inserted into and withdrawn from the first extension EX1, and the third extension EX3 may be inserted into and withdrawn from the second extension EX2. The first extension EX1 may be disposed in the housing HS, and the second and third extensions EX2 and EX3 may move outwardly from the housing HS. The third extension EX3 may be connected to the handle HND.

A guide groove GG may be defined on each of the first, second, and third extensions EX1, EX2, and EX3. The guide grooves GG on the first, second, and third extensions EX1, EX2, and EX3 may be defined as a continuous space that overlap each other in the first direction DR1. The module supporter MSP may be disposed in the guide grooves GG.

In case that the handle HND moves in the first direction DR1 to approach the housing HS, as shown in FIGS. 8 and 9, the handle HND may be disposed outside the housing HS and adjacent to the opening OP. In accordance with the movement of the handle HND, the supporter SUP may contract in the first direction DR1 to enter the housing HS, and the display module DM and the module supporter MSP may be inserted into the housing HS.

Figure 15:
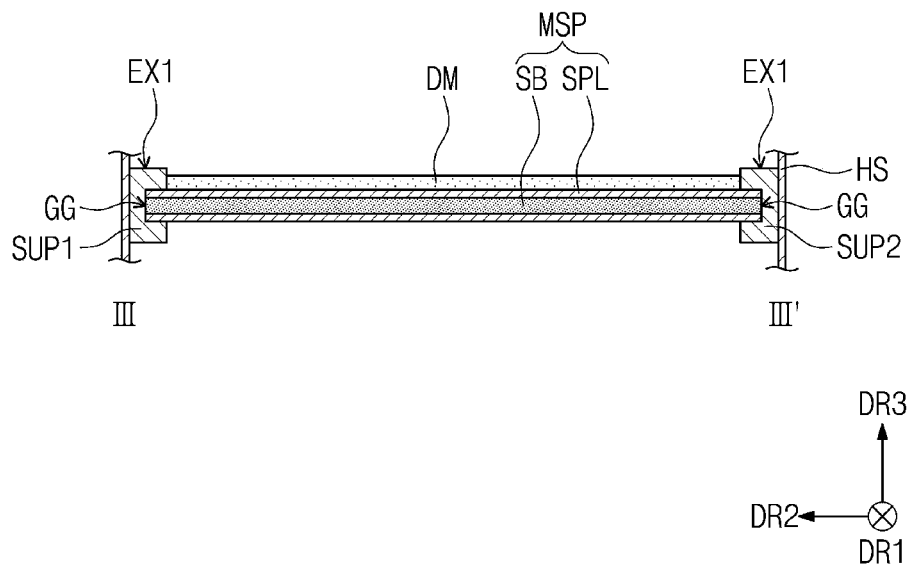
FIG. 15 illustrates a schematic cross-sectional view taken along line of FIG. 2.
Figure 16:
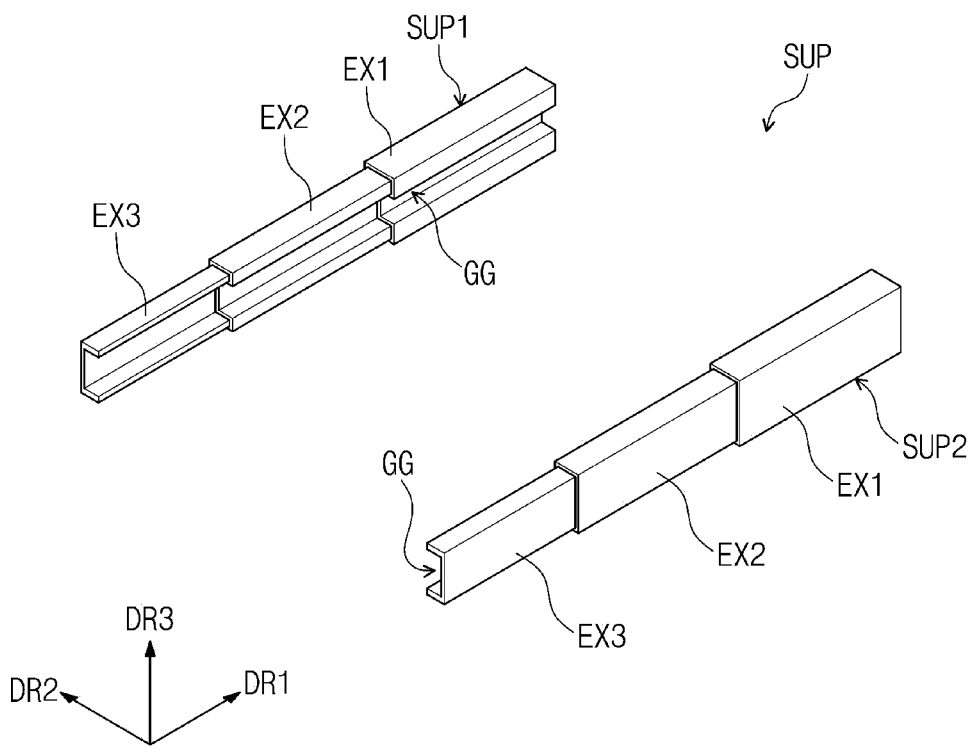
FIG. 16 illustrates a schematic perspective view showing a supporter depicted in FIG. 14.

FIG. 15 illustrates a schematic cross-sectional view taken along line of FIG. 2. FIG. 16 illustrates a schematic perspective view showing the supporter depicted in FIG. 14.

Substantially, FIG. 15 illustrates the module supporter MSP disposed on the first and second supporters SUP1 and SUP2. For convenience of description, FIG. 15 depicts the module supporter MSP disposed on the first and second supporters SUP1 and SUP2, the display module DM disposed on the module supporter MSP, and portions of the housing HS adjacent to the first and second supporters SUP1 and SUP2, and other components are omitted.

Referring to FIGS. 15 and 16, the supporter SUP may include the first supporter SUP1 and the second supporter SUP2 that extend in the first direction DR1 and are spaced apart from each other in the second direction DR2. The first and second supporters SUP1 and SUP2 may be accommodated in the housing HS.

The first and second supporters SUP1 and SUP2 may support both sides of the module supporter MSP that are opposite to each other in the second direction DR2. For example, the both sides of the module supporter MSP may be disposed in and inserted into the guide grooves GG that are defined on opposing inner surfaces of the first and second supporters SUP1 and SUP2. The module supporter MSP may move in the first direction DR1 along the guide grooves GG defined on the first and second supporters SUP1 and SUP2.

Each of the first and second supporters SUP1 and SUP2 may include the first extension EX1, the second extension EX2, and the third extension EX3 that have the guide grooves GG. Configurations of the first, second, and third extensions EX1, EX2, and EX3 are described in detail above, and thus a description thereof will be omitted.

The first and second supporters SUP1 and SUP2 may have ends that are defined as an end of the supporter SUP and are connected to the handle HND. For example, the third extensions EX3 of the first and second supporters SUP1 and SUP2 may be connected to the handle HND.

The first extensions EX1 may be connected to the housing HS. For example, the first extension EX1 may be fixedly connected to inner surfaces of the housing HS that face each other in the second direction DR2. In the open mode, the first extension EX1 may be disposed in the housing HS, and the second and third extensions EX2 and EX3 may move outwardly from the housing HS. Thus, in the open mode, the first and second supporters SUP1 and SUP2 may be expanded outward from the housing HS.

The display module DM may be disposed on the module supporter MSP and between the first and second supporters SUP1 and SUP2.

Figure 17:
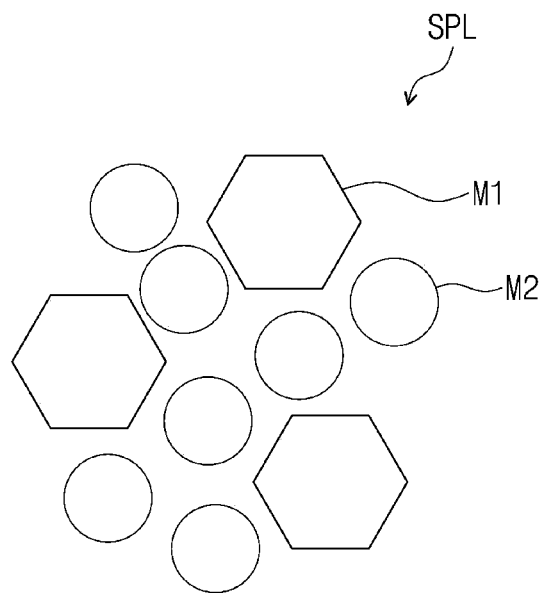
FIGS. 17 and 19 illustrate schematic diagrams showing a configuration of a support layer depicted in FIG. 10.
Figure 19:
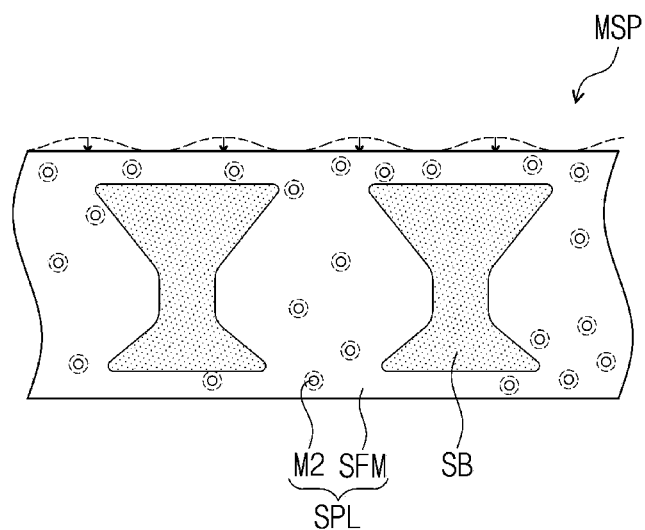

FIGS. 17 and 19 illustrate schematic diagrams showing a configuration of the support layer SPL depicted in FIG. 10.

Figure 18:
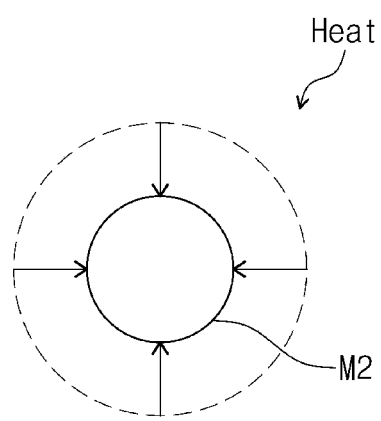

Referring to FIGS. 17 and 18, the support layer SPL may include a first material M1 and a second material M2 that has a negative coefficient of thermal expansion (CTE). The first material M1 may include an elastomeric polymer discussed above. The second material M2 may include at least one among $ZrW_2O_8$, $ZrV_2O_2$, $Ag_3Co(CN)_6$, and $Sc_2(WO_4)_3$.

A material whose coefficient of thermal expansion is positive may expand when heated and contract when cooled. In contrast, the second material M2 whose coefficient of thermal expansion is negative may contract when heat is applied. In addition, the second material M2 whose coefficient of thermal expansion is negative may expand when cooled. The first and second materials M1 and M2 may be mixed with each other, and the second material M2 may have a fraction about 20% to about 40% compared to the first material M1.

The support layer SPL may be fabricated as follows. Particles of the first material M1 may be mixed with particles of the second material M2, and the first material M1 may be melted. The first material M1 may be liquid, and the second material M2 may maintain a solid particle state.

The second material M2, or solid particles, may be distributed in the liquid first material M1.

The second material M2, or solid particles, may be distributed in the liquid first material M1, and the first material M1 may be cured, which may result in the formation of the support layer SPL. As discussed above, the support bars SB may be disposed in the support layer SPL. The cured first material M1 will be defined as a support film in FIG. 19 below.

The support bars SB and the first material M1 may each have a positive coefficient of thermal expansion (CTE). The CTE of the support bars SB may be different from that of the first material M1.

Referring to FIG. 19, the support layer SPL may include a support film SFM formed of the cured first material M1 and may also include the second material M2 whose CTE is negative. The support film SFM may have a predetermined elasticity by including a resilient elastomeric polymer discussed above.

Because the support bars SB and the support film SFM have different CTEs, the differently expanded support bars SB and support film SFM may stretch a surface of the support layer SPL, and therefore wrinkles may be formed thereon. For example, dotted lines are used to indicate the wrinkles formed on the surface of the support layer SPL.

In contrast, the second material M2 whose CTE is negative may contract in case that heat is applied to the module supporter MSP. For example, as shown in FIG. 19, a circular dotted line is illustrated to indicate the second material M2 before contraction, and a circular solid line is illustrated to indicate the second material M2 after contraction. The contraction of the second material M2 may cause contraction of the support layer SPL, and thus no wrinkle may be formed on the surface of the support layer SPL.

In conclusion, as the support layer SPL includes the second material M2 whose CTE is negative, the support layer SPL may be prevented from being deformed.

Figure 20:
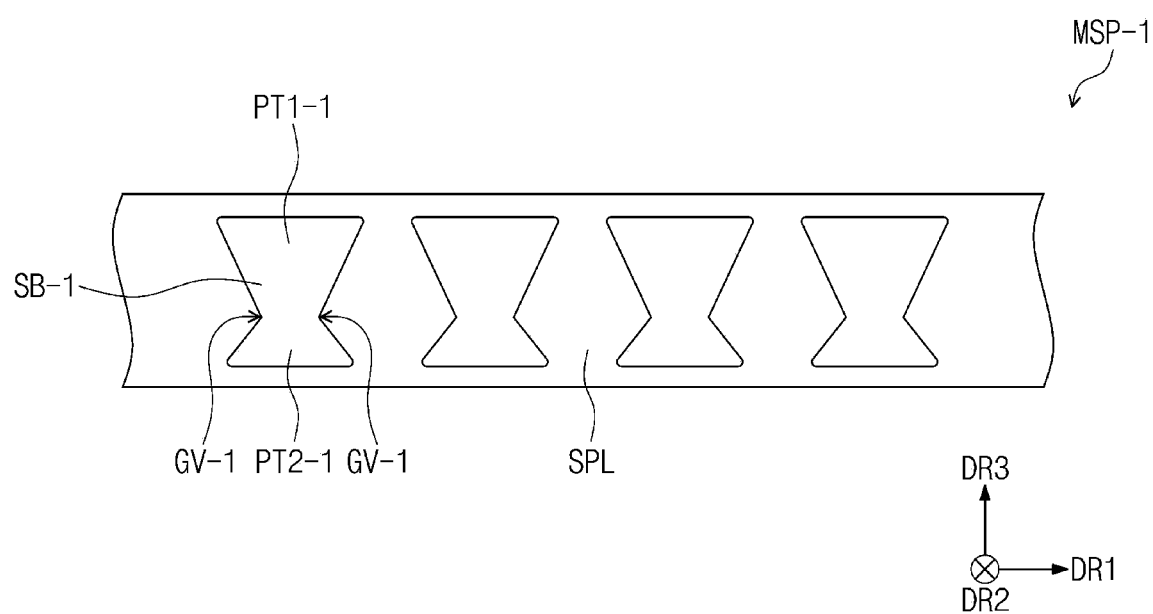
FIGS. 20 to 22 illustrate schematic diagrams showing support bars according to some embodiments of the disclosure.
Figure 21:
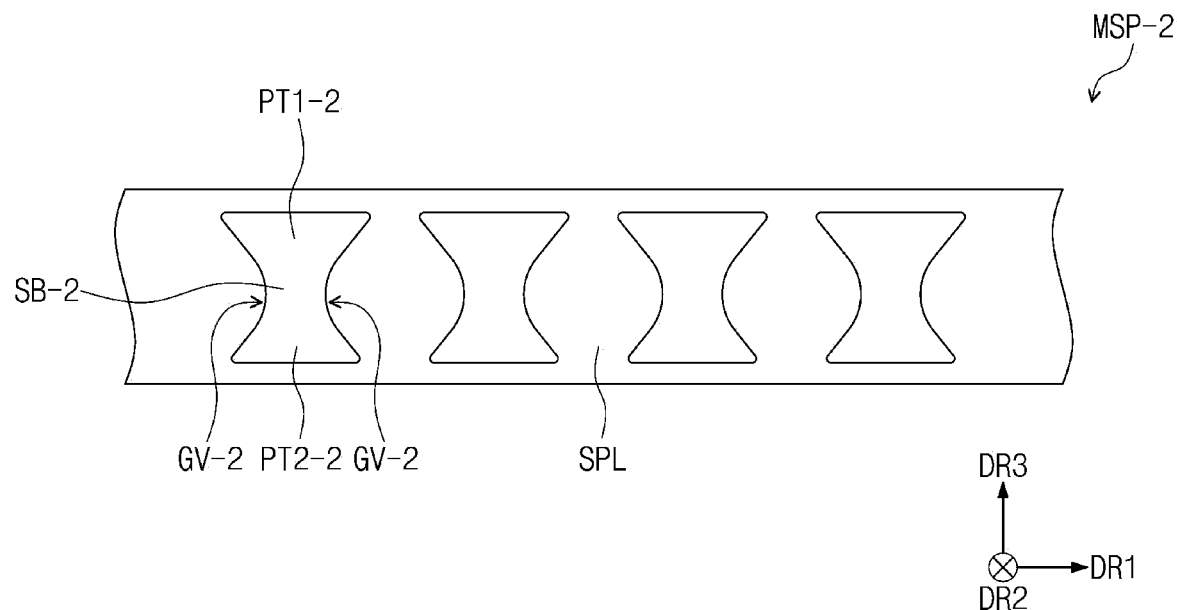
Figure 22:
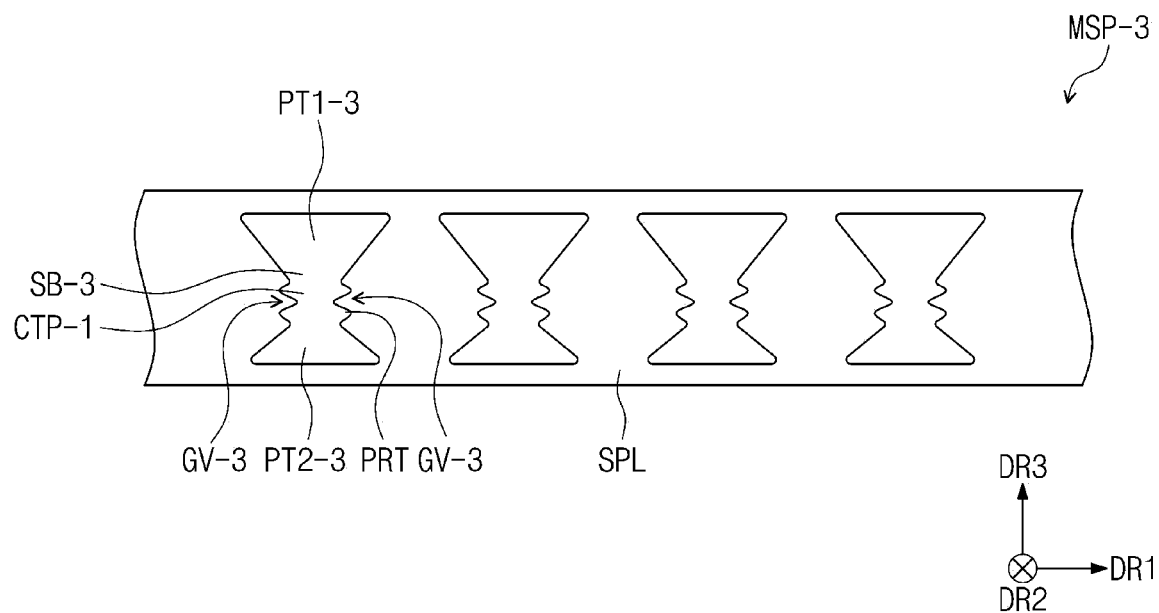

FIGS. 20 to 22 illustrate schematic diagrams showing support bars according to some embodiments.

FIGS. 20 to 22 depict by way of example side views of support bars SB-1, SB-2, and SB-3 when viewed in the second direction DR2.

Referring to FIG. 20, a module supporter MSP-1 may include a support layer SPL and support bars SB-1 disposed in the support layer SPL. A k-th support bar SB-1 may have both lateral surfaces which are opposite to each other in the first direction DR1 and on each of which is defined as a groove GV-1 shaped like a letter "V" or a valley.

The k-th support bar SB-1 may be divided into a first part PT1-1 and a second part PT2-1 with respect to a lowermost point of the letter "V" or the valley. The second part PT2-1 may be disposed below the first part PT1-1. The first part PT1-1 may have a width in the first direction DR1 that increases in an upward direction, and the second part PT2-1 may have a width in the first direction DR1 that increases in a downward direction.

Referring to FIG. 21, a module supporter MSP-2 may include a support layer SPL and support bars SB-2 disposed in the support layer SPL. A k-th support bar SB-2 may have both lateral surfaces which are opposite to each other in the first direction DR1 and on each of which is defined as a groove GV-2 having a concavely curved shape.

The k-th support bar SB-2 may be divided into a first part PT1-2 and a second part PT2-2 with respect to a lowermost point of the concavely curved shape. The second part PT2-2 may be disposed below the first part PT1-2. The first part PT1-2 may have a width in the first direction DR1 that increases in an upward direction, and the second part PT2-2 may have a width in the first direction DR1 that increases in a downward direction.

Referring to FIG. 22, a module supporter MSP-3 may include a support layer SPL and support bars SB-3 disposed in the support layer SPL. A k-th support bar SB-3 may have a groove GV-3 defined on each of both lateral surfaces thereof that are opposite to each other in the first direction DR1. Protrusions PRT may be included in each of the both lateral surfaces that are recessed inward toward the k-th support bar SB-3, and thus the result the groove GV-3 may be defined.

The k-th support bar SB-3 may include a first part PT1-3, a second part PT2-3 disposed below the first part PT1, and a third part CTP-1 between the first part PT1-3 and the second part PT2-3. The first part PT1-3 may have a width in the first direction DR1 that increases in an upward direction, and the second part PT2-3 may have a width in the first direction DR1 that increases in a downward direction.

The third part CTP-1 may extend from the first part PT1-3 toward the second part PT2-3. The third part CTP-1 may include the protrusions PRT that protrude in the first direction DR1.

Figure 23:
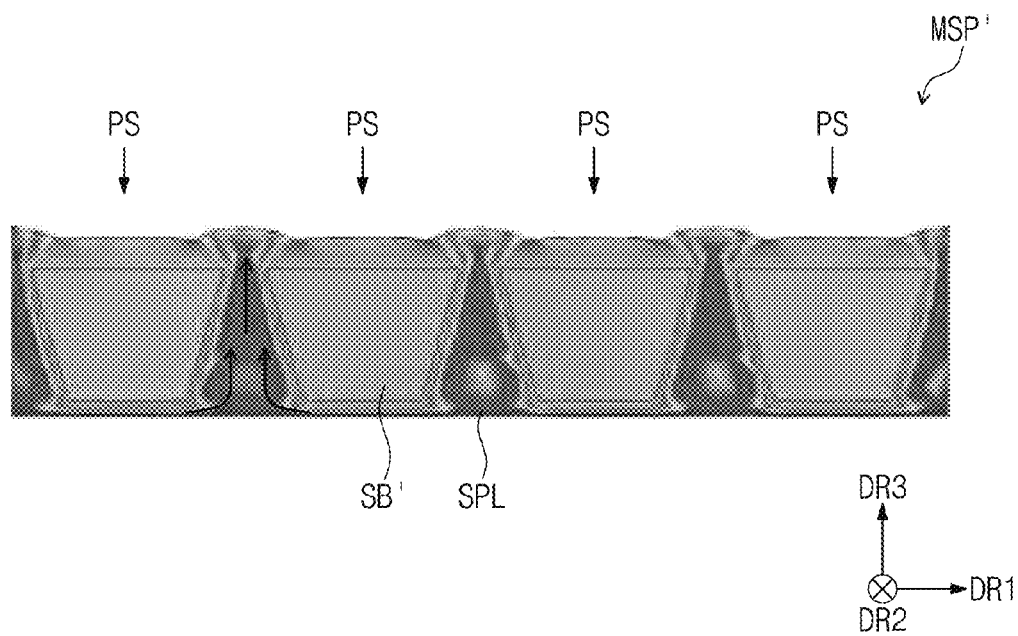
FIG. 23 illustrates a schematic diagram showing an experimental result of a module supporter according to a comparative example.
Figure 24:
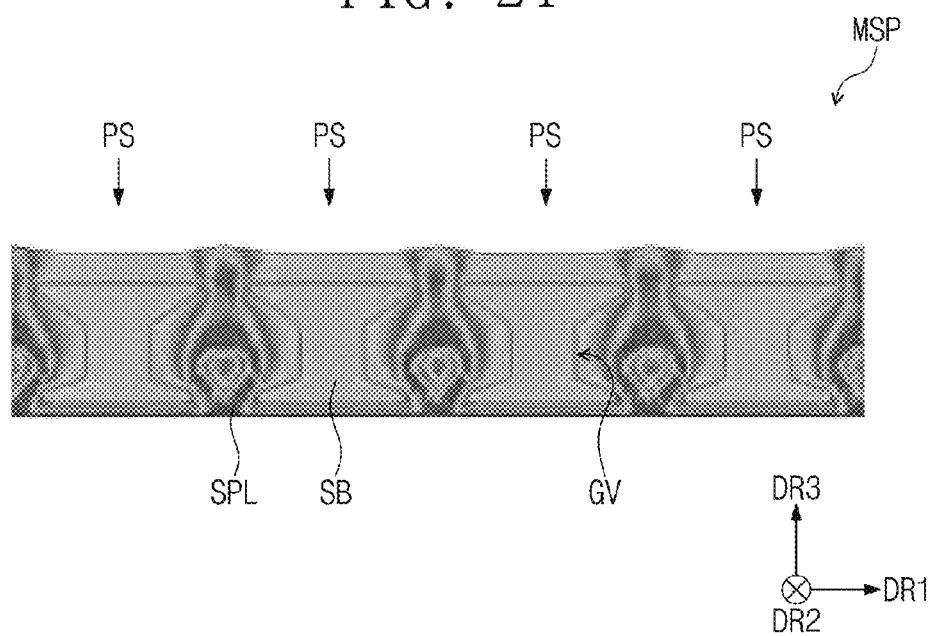
FIGS. 24 and 25 illustrate schematic diagrams showing experimental results of a module supporter according to an embodiment of the disclosure.
Figure 25:
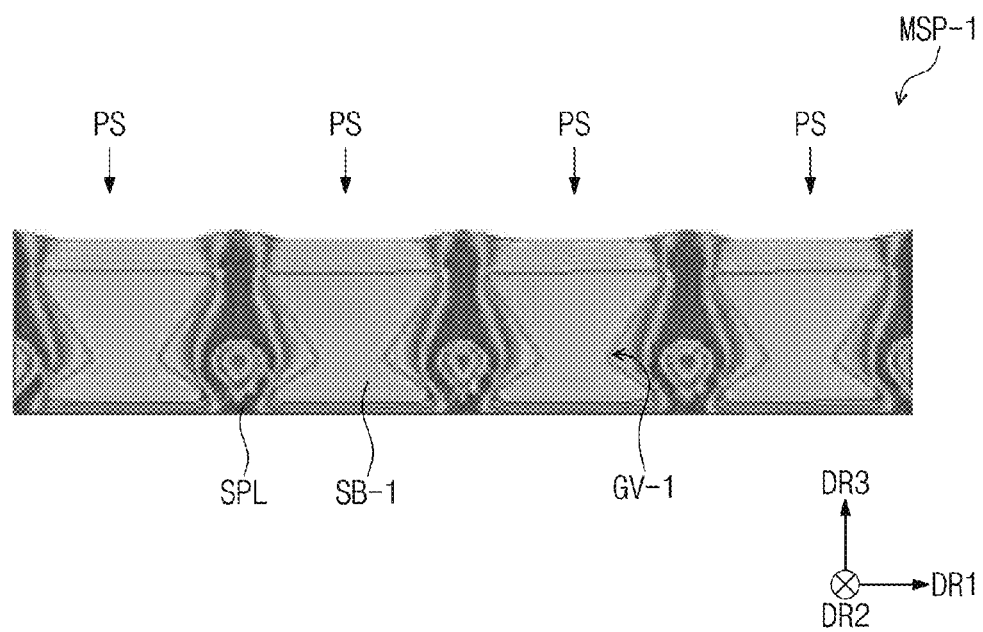

FIG. 23 illustrates a schematic diagram showing an experimental result of a module supporter according to a comparative example. FIGS. 24 and 25 illustrate schematic diagrams showing experimental results of a module supporter according to an embodiment.

For example, FIG. 24 illustrates an experimental result of the module supporter MSP depicted in FIG. 10, and FIG. 25 illustrates an experimental result of the module supporter MSP-1 depicted in FIG. 20.

Referring to FIG. 23, a module supporter MSP' may receive a pressure PS on a top surface of the module supporter MSP' that includes support bars SB' each having an inverted trapezoidal shape. For example, the display module DM may be disposed on the module supporter MSP', and may be provided with the certain pressure PS to attach the display module DM to the module supporter MSP'.

In the embodiment, an experiment was performed in such a way that a pressure tool (not shown) was used to apply the pressure PS to the module supporter MSP' without the display module DM. The same experiment was conducted on the module supporter MSP and the module supporter MSP-1 which will be discussed below.

The support layer SPL may contract in case that the pressure PS is applied to the module supporter MSP'. The support bars SB' may be pressurized to contract a lower portion of the support layer SPL. In this case, because the support layer SPL has fluidity, the pressure PS may move the support layer SPL toward an area.

The support layer SPL may contract at a lower portion thereof, and a material of the support layer SPL may upwardly move through a space between lower ends of the support bars SB'. Among spaces of the support bars SB', the space between the lower ends of the support bars SB' may increase due to the inverted trapezoidal shapes of the support bars SB'. The material of the support layer SPL that moves upward through the space between the lower ends of the support bars SB' may cause a portion of the support layer SPL to protrude upward between the upper ends of the support bars SB'.

A measured value of about $7.354 \times 10^{-5}$ mm was obtained as a displacement of a top surface of the support layer SPL. The displacement may be defined as a difference in length between top and bottom positions of the top surface of the support layer SPL.

Referring to FIG. 24, a pressure PS may be applied to the module supporter MSP that includes the support bars SB each having a dumbbell shape. In case that the pressure PS is applied to the module supporter MSP, the support layer SPL may be pressurized to contract a lower portion of the support layer SPL.

A space between lower ends of the support bars SB each having the dumbbell shape may be narrower than the space between the lower ends of the support bars SB' each having an inverted trapezoidal shape. Therefore, the support layer SPL may have a reduction in upward movement through the space between the lower ends of the support bars SB.

Because the grooves GV are filled with the support layer SPL, the volume and weight of the support layer SPL disposed in the grooves GV may be increased. The support layer SPL disposed between the support bars SB each having a dumbbell shape may have volume and weight greater than those of the support layer SPL disposed between the support bars SB' each having an inverted trapezoidal shape.

In this case, the support layer SPL disposed in the grooves GV may improve resistance against the external pressure PS, and thus the supporting force of the support bars SB may increase. The support layer SPL disposed in the groove GV may support the support bars SB so as to barely move downward.

In case that the pressure PS is applied to the support layer SPL, the support layer SPL disposed in the grooves GV may mitigate the upward movement or flow of the support layer SPL through the space between the lower ends of the support bars SB. Because the movement of the support layer SPL is reduced by the support layer SPL disposed in the grooves GV, the displacement of the support layer SPL moving upward may be decreased.

A measured value of about $4.605 \times 10^{-5}$ mm was obtained as a displacement amount at a top surface of the support layer SPL in which the dumbbell-shaped support bars SB are disposed. In other words, it may be possible to decrease pressure-induced deformation of the support layer SPL. Therefore, the flatness of the top surface of the module supporter MSP including the dumbbell-shaped support bars SB may be greater than that at the top surface of the module supporter MSP' including the inverted trapezoidal support bars SB'.

Referring to FIG. 25, in case that a pressure PS is applied to the module supporter MSP-1 that includes the support bars SB-1 each having a dumbbell shape, the support bars SB-1 may be pressurized to contract a lower portion of the support layer SPL. A relatively narrow space may be provided between lower ends of the support bars SB-1 each having a dumbbell shape, and thus the support layer SPL may have a reduction in upward movement through the space between the lower ends of the support bars SB-1.

Because the grooves GV-1 are filled with the support layer SPL, the support layer SPL disposed in the grooves GV-1 may have volume and weight greater than those of the support layer SPL disposed between the support bars SB' each having an inverted trapezoidal shape. In this case, the support layer SPL disposed in the grooves GV-1 may improve resistance against the external pressure PS, and thus the supporting force of the support bars SB-1 may increase. In case that the pressure PS is applied to the support layer SPL, the support layer SPL disposed in the grooves GV-1 may mitigate the upward movement of the support layer SPL through the space between the lower ends of the support bars SB-1.

A measured value of about $5.111 \times 10^{-5}$ mm was obtained as a displacement amount at a top surface of the support layer SPL in which the dumbbell-shaped support bars SB-1. A flatness at the top surface of the module supporter MSP-1 including the dumbbell-shaped support bars SB-1 may be greater than that at the top surface of the module supporter MSP' including the inverted trapezoidal support bars SB'.

In an embodiment, the flatness of the module supporter MSP or MSP-1 including the dumbbell-shaped support bars SB or SB-1 may increase. The increase in flatness of the module supporter MSP or MPS-1 may induce an increase in surface quality of the display module DM disposed on the module supporter MSP or MSP-1.

Figure 26:
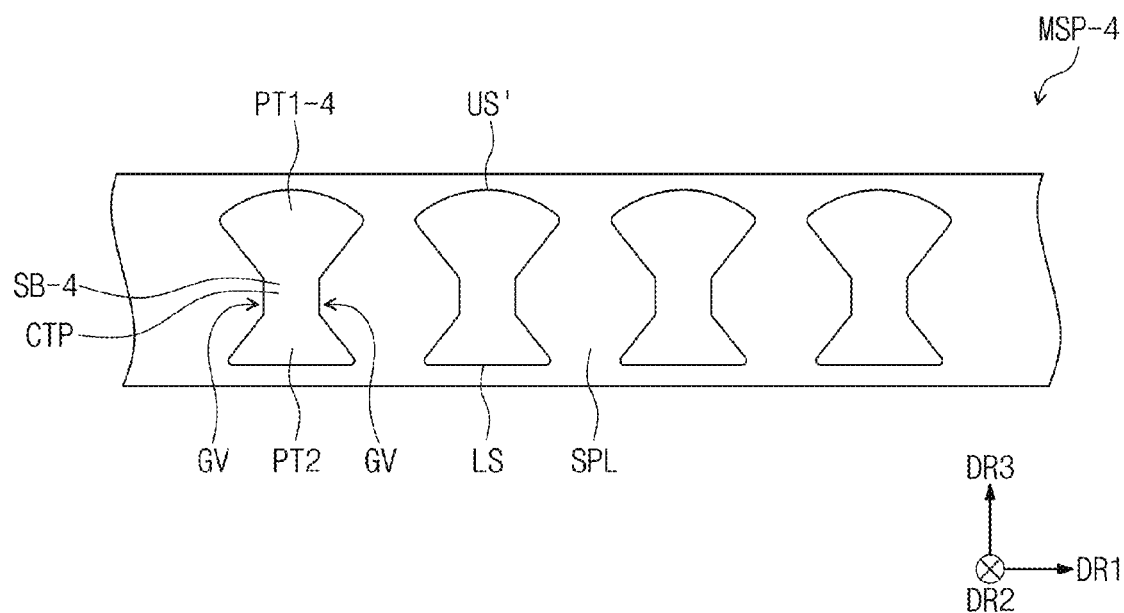
FIGS. 26 and 27 illustrate schematic diagrams showing support bars according to some embodiments of the disclosure.
Figure 27:
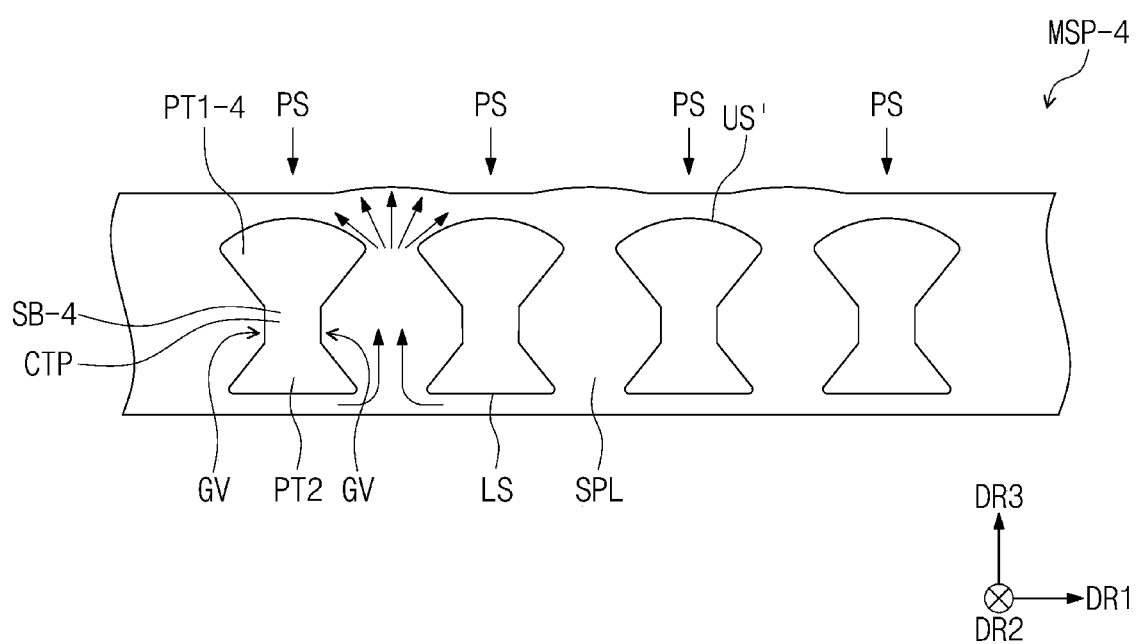

FIGS. 26 and 27 illustrate schematic diagrams showing support bars according to some embodiments.

Referring to FIG. 26, a module supporter MSP-4 may include a support layer SPL and support bars SB-4 disposed in the support layer SPL. A k-th support bar SB-4 may have a groove GV defined on each of both lateral surfaces thereof that are opposite to each other in the first direction DR1. The grooves GV depicted in FIGS. 10 and 26 may have the same shape.

The k-th support bar SB-4 may include a first part PT1-4, a second part PT2 smaller than the first part PT1-4, and a third part CTP between the first part PT1-4 and the second part PT2. The second part PT2 and the third part CTP may respectively be the same as the second part PT2 and the third part CTP depicted in FIG. 10.

The first part PT1-4 may have a top surface US' that defines a top surface of the k-th support bar SB-4 and has a curved surface that is upwardly convex. The first part PT1-4 may have a width in the first direction DR1 that increases in an upward direction, except a convex portion of the first part PT1-4.

Referring to FIG. 27, in case that the module supporter MSP-4 is pressurized, a material of the support layer SPL may upwardly move through a space between the support bars SB-4. In the embodiment, because the support bars SB-4 have top surfaces US', which are convexly curved surfaces, the materials of the support layer SPL that move upward through the space between the support bars SB-4 may be radially distributed between upper ends of the support bars SB-4.

Because the materials of the support layer SPL that move upward between the support bars SB-4 are radially distributed between the upper ends of the support bars SB-4, the support layer SPL may less protrude upwardly between the support bars SB-4. As a result, a displacement amount at a top surface of the support layer SPL may be reduced to increase the flatness at a top surface of the module supporter MSP-4.

According to an embodiment, a display module may be provided thereunder with a module supporter including a support layer which provides a flat top surface to the display module, and also including support bars which are disposed in the support layer and each of which has a modulus greater than that of the support layer.

As the support bars have dumbbell shapes, it may be possible to decrease weights of the support bars and to increase contact areas between the support layer and the support bars, and accordingly adhesive forces may be increased between the support layer and the support bars.

As the support bars have dumbbell shapes, the support layer may have increased portions disposed between grooves defined on lateral surfaces of the support bars, and accordingly the support layer may have an increased supporting force against an external pressure.

In case that the support bars have dumbbell shapes, deformation of the support layer because of pressure may be reduced, and thus the flatness at a top surface thereof may be increased.

Although the disclosure is described in conjunction with some embodiments thereof, it would be understood by those skilled in the art that the disclosure can be modified or changed in various ways without departing from spirit and scope of the disclosure. Further, the embodiments disclosed herein are not intended to limit the technical spirit of the disclosure and all technical spirit within the claims and their equivalents should be construed as being included in the disclosure.

What is claimed is:

1. A display device, comprising:
    a display module; and
    a module supporter below the display module, wherein the module supporter includes:
        a support layer; and
        a plurality of support bars, an entirety of each of the plurality of support bars being disposed inside the support layer between an upper surface of the support layer and a lower surface of the support layer, the plurality of support bars being separated from each other and arranged in a first direction, and the plurality of support bars extending in a second direction that intersects the first direction, and
    at least one groove having a predetermined shape is formed on lateral surfaces of at least one of the plurality of support bars, the lateral surfaces being opposite to each other in the first direction.

2. The display device of claim 1, wherein the at least one of the plurality of support bars includes:
    a first part that faces the display module;
    a second part below the first part; and
    a third part between the first part and the second part, the third part having a width in the first direction less than a width in the first direction of each of the first and second parts.

3. The display device of claim 2, wherein the width in the first direction of the first part increases in an upward direction toward the display module.

4. The display device of claim 2, wherein the width in the first direction of the second part increases continuously in a downward direction away from the display module.

5. The display device of claim 2, wherein the third part has a constant width and extends from the first part toward the second part.

6. The display device of claim 2, wherein a size of the first part is greater than a size of the second part.

7. The display device of claim 6, wherein a length in the first direction of a top surface of the first part is greater than a length in the first direction of a bottom surface of the second part.

8. The display device of claim 2, wherein
the support layer includes:
    a first support layer between the first parts of the plurality of support bars that are adjacent to each other;
    a second support layer between the second parts of the plurality of support bars that are adjacent to each other; and
    a third support layer between the third parts of the plurality of support bars that are adjacent to each other, and
    a width in the first direction of the third support layer is greater than each of a width in the first direction of the first support layer and a width in the first direction of the second support layer.

9. The display device of claim 1, wherein
the at least one groove includes a plurality of grooves, and
a first volume of the support layer between the plurality of grooves that are adjacent to each other is greater than each of a second volume of the support layer on each of the plurality of support bars and a third volume of the support layer below each of the plurality of support bars.

10. The display device of claim 1, wherein the at least one groove extends in the second direction.

11. The display device of claim 1, wherein the support layer fills the at least one groove.

12. The display device of claim 1, wherein the at least one groove has a letter "V" shape.

13. The display device of claim 1, wherein the at least one groove has a concavely curved shape.

14. The display device of claim 1, wherein each of the lateral surfaces includes a plurality of protrusions.

15. The display device of claim 1, wherein a top surface of at least one of the plurality of support bars has a curved surface that is upwardly convex, the top surface facing the display module.

16. The display device of claim 1, wherein each of the plurality of support bars has a modulus greater than a modulus of the support layer.

17. The display device of claim 1, wherein the support layer includes:
    a support film that includes an elastomeric polymer; and
    the support film includes a material having a negative coefficient of thermal expansion.

18. A display device comprising:
    a display module;
    a support layer below the display module; and
    a plurality of support bars, an entirety of each of the plurality of support bars being disposed inside the support layer between an upper surface of the support layer and a lower surface of the support layer, the plurality of support bars being separated from each other and arranged in a first direction, and the plurality of support bars extending in a second direction that intersects the first direction,
    wherein each support bar has a dumbbell shape as seen in side view.

19. The display device of claim 18, wherein each of the plurality of the support bars includes:
    a first part that faces the display module;
    a second part below the first part and having a size less than a size of the first part; and
    a third part having a width smaller than a width of each of the first part and the second part as seen in side view, the third part extending from the first part toward the second part.

20. A display device comprising:
    a display module;
    a support layer below the display module; and
    a plurality of support bars, an entirety of each of the plurality of support bars being disposed inside the support layer between an upper surface of the support layer and a lower surface of the support layer, the plurality of support bars being separated from each other and arranged in a first direction, and the plurality of support bars extending in a second direction that intersects the first direction, wherein at least one of the plurality of support bars includes:
- a first part that faces the display module;
- a second part below the first part and having a size less than a size of the first part; and
- a third part that extends from the first part toward the second part, the third part having a width in the first direction less than a width in the first direction of each of the first and second parts.

21. The display device of claim 1, wherein immediately adjacent support bars of the plurality of support bars are spaced apart from each other when the support layer is flat.

* * * * *